(12) United States Patent
Kobayashi et al.

(10) Patent No.: US 10,403,517 B2
(45) Date of Patent: Sep. 3, 2019

(54) SUBSTRATE PROCESSING APPARATUS

(71) Applicant: SCREEN Holdings Co., Ltd., Kyoto (JP)

(72) Inventors: Kenji Kobayashi, Kyoto (JP); Jun Sawashima, Kyoto (JP); Yuta Nishimura, Kyoto (JP); Akihiro Nakashima, Kyoto (JP); Motoyuki Shimai, Kyoto (JP); Akito Hatano, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 502 days.

(21) Appl. No.: 15/044,452

(22) Filed: Feb. 16, 2016

(65) Prior Publication Data

US 2016/0240399 A1    Aug. 18, 2016

(30) Foreign Application Priority Data

Feb. 18, 2015  (JP) .................... 2015-29844
Mar. 3, 2015   (JP) .................... 2015-41348
Mar. 3, 2015   (JP) .................... 2015-41378

(51) Int. Cl.
   *H01L 21/67*   (2006.01)

(52) U.S. Cl.
   CPC .... *H01L 21/6708* (2013.01); *H01L 21/67017* (2013.01); *H01L 21/67028* (2013.01); *H01L 21/67051* (2013.01); *H01L 21/67109* (2013.01); *H01L 21/67248* (2013.01)

(58) Field of Classification Search
   CPC ............... H01L 21/6708; H01L 21/67051
   See application file for complete search history.

(56) References Cited

U.S. PATENT DOCUMENTS

| | | | |
|---|---|---|---|
| 5,634,980 A | 6/1997 | Tomita et al. | 134/3 |
| 6,299,697 B1 | 10/2001 | Nishibe et al. | 134/3 |
| 2002/0118245 A1 | 8/2002 | Jagannathan et al. | 347/21 |
| 2004/0261817 A1 | 12/2004 | Araki et al. | 134/2 |
| 2006/0139594 A1 | 6/2006 | Hara et al. | 355/53 |
| 2007/0175863 A1 | 8/2007 | Koyata et al. | 216/84 |
| 2009/0004876 A1 | 1/2009 | Koyata et al. | 438/753 |
| 2009/0056746 A1* | 3/2009 | Sandhu | B08B 3/02 134/3 |
| 2010/0202867 A1 | 8/2010 | Hamada | 414/806 |

(Continued)

FOREIGN PATENT DOCUMENTS

| | | |
|---|---|---|
| CN | 101689500 A | 3/2010 |
| CN | 102034730 A | 4/2011 |

(Continued)

*Primary Examiner* — Spencer E Bell
(74) *Attorney, Agent, or Firm* — Ostrolenk Faber LLP

(57) ABSTRACT

A supply flow passage branches into a plurality of upstream flow passages. A plurality of discharge ports are respectively disposed at a plurality of positions differing in distance from a rotational axis of a substrate. Hydrogen peroxide water, that is one of components of a chemical liquid (SPM), is supplied to the upstream flow passage from a component liquid flow passage. A mixing ratio changing unit including a plurality of first flow control valves and a plurality of second flow control valves independently changes mixing ratios of sulfuric acid and hydrogen peroxide water included in the chemical liquid to be discharged from the plurality of discharge ports for each of the upstream flow passages.

12 Claims, 9 Drawing Sheets

(56) References Cited

U.S. PATENT DOCUMENTS

| | | | |
|---|---|---|---|
| 2010/0279008 A1 | 11/2010 | Takagi | 427/248.1 |
| 2010/0319734 A1* | 12/2010 | Minami | H01L 21/67051 |
| | | | 134/26 |
| 2011/0079252 A1 | 4/2011 | Minamida et al. | 134/94.1 |
| 2011/0277793 A1 | 11/2011 | Inada et al. | 134/18 |
| 2012/0074102 A1 | 3/2012 | Magara et al. | 216/83 |
| 2012/0118332 A1 | 5/2012 | Sato et al. | 134/30 |
| 2012/0186275 A1 | 7/2012 | Kato et al. | 62/64 |
| 2013/0014787 A1 | 1/2013 | Urata et al. | 134/100.1 |
| 2013/0020284 A1* | 1/2013 | Osada | H01L 21/67028 |
| | | | 216/57 |
| 2013/0048609 A1 | 2/2013 | Ito et al. | 216/83 |
| 2013/0057836 A1 | 3/2013 | Nakashima et al. | 355/27 |
| 2013/0284367 A1 | 10/2013 | Kang et al. | 156/345.18 |
| 2013/0340796 A1 | 12/2013 | Kawano et al. | 134/28 |
| 2014/0231010 A1* | 8/2014 | Park | H01L 21/67075 |
| | | | 156/345.11 |

FOREIGN PATENT DOCUMENTS

| | | |
|---|---|---|
| JP | H6-291098 A | 10/1994 |
| JP | 07-245287 A | 9/1995 |
| JP | H11-165114 A | 6/1999 |
| JP | 2001-129495 A | 5/2001 |
| JP | 2002-361125 A | 12/2002 |
| JP | 2004-111668 A | 4/2004 |
| JP | 2005-039205 A | 2/2005 |
| JP | 2005-217226 A | 8/2005 |
| JP | 2006-344907 | 12/2006 |
| JP | 2007-200954 A | 8/2007 |
| JP | 2007-207810 A | 8/2007 |
| JP | 2008-258437 A | 10/2008 |
| JP | 2011-211092 A | 10/2011 |
| JP | 2012-4539 A | 1/2012 |
| JP | 2012-74601 A | 4/2012 |
| JP | 2013-110324 A | 6/2013 |
| JP | 2014-022678 A | 2/2014 |
| JP | 2014-27245 A | 2/2014 |
| KR | 10-2009-0059747 A | 6/2009 |
| KR | 10-2013-0023123 A | 3/2013 |
| KR | 10-2013-0122505 A | 11/2013 |
| TW | 201236052 | 9/2012 |
| TW | 201308494 | 2/2013 |
| TW | 201432788 | 8/2014 |
| WO | WO 2007/088755 A1 | 8/2007 |

* cited by examiner

FIG. 1 Discharging state

FIG. 2 Discharge stoppage state

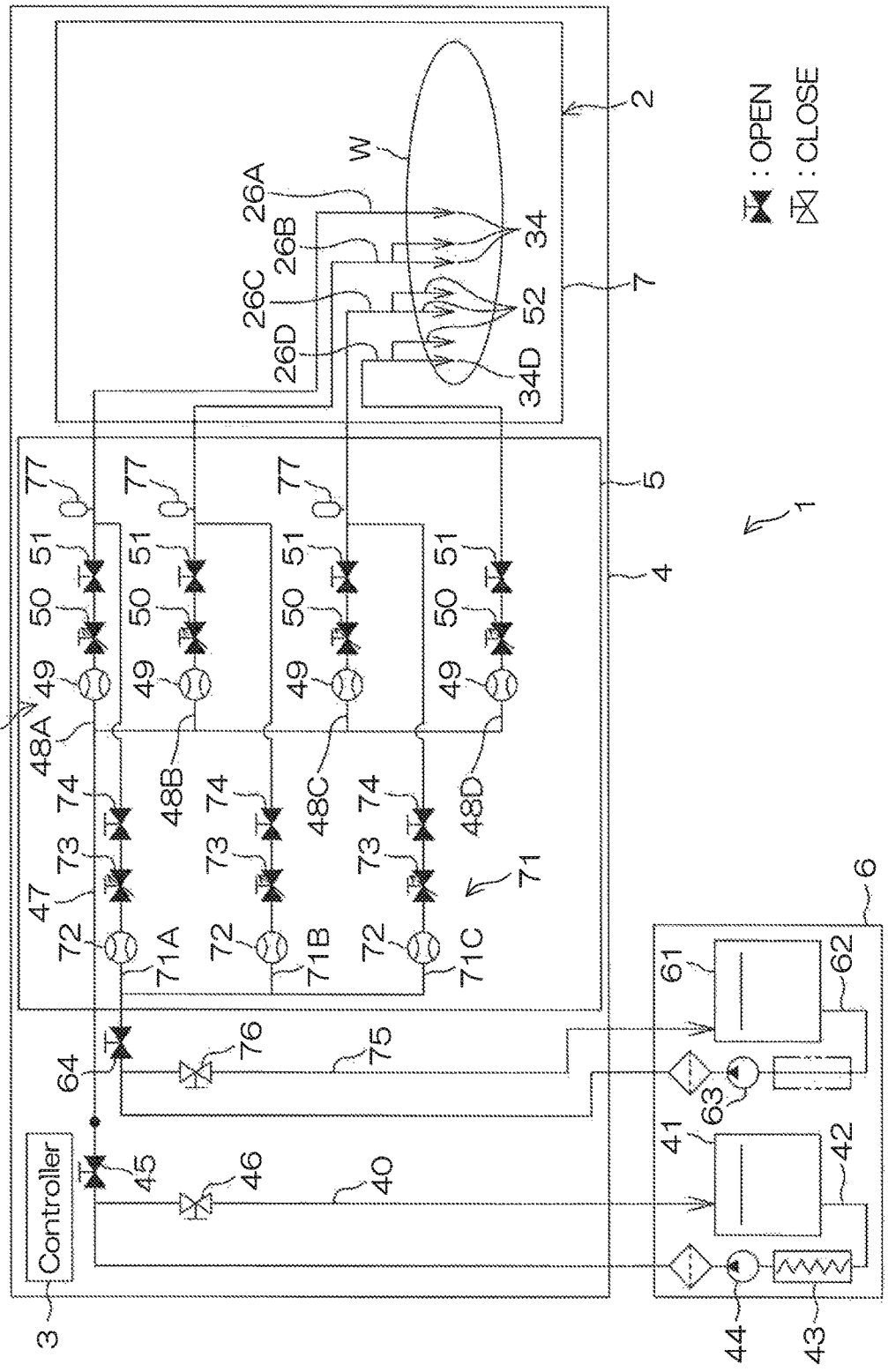
FIG. 13 Discharging state

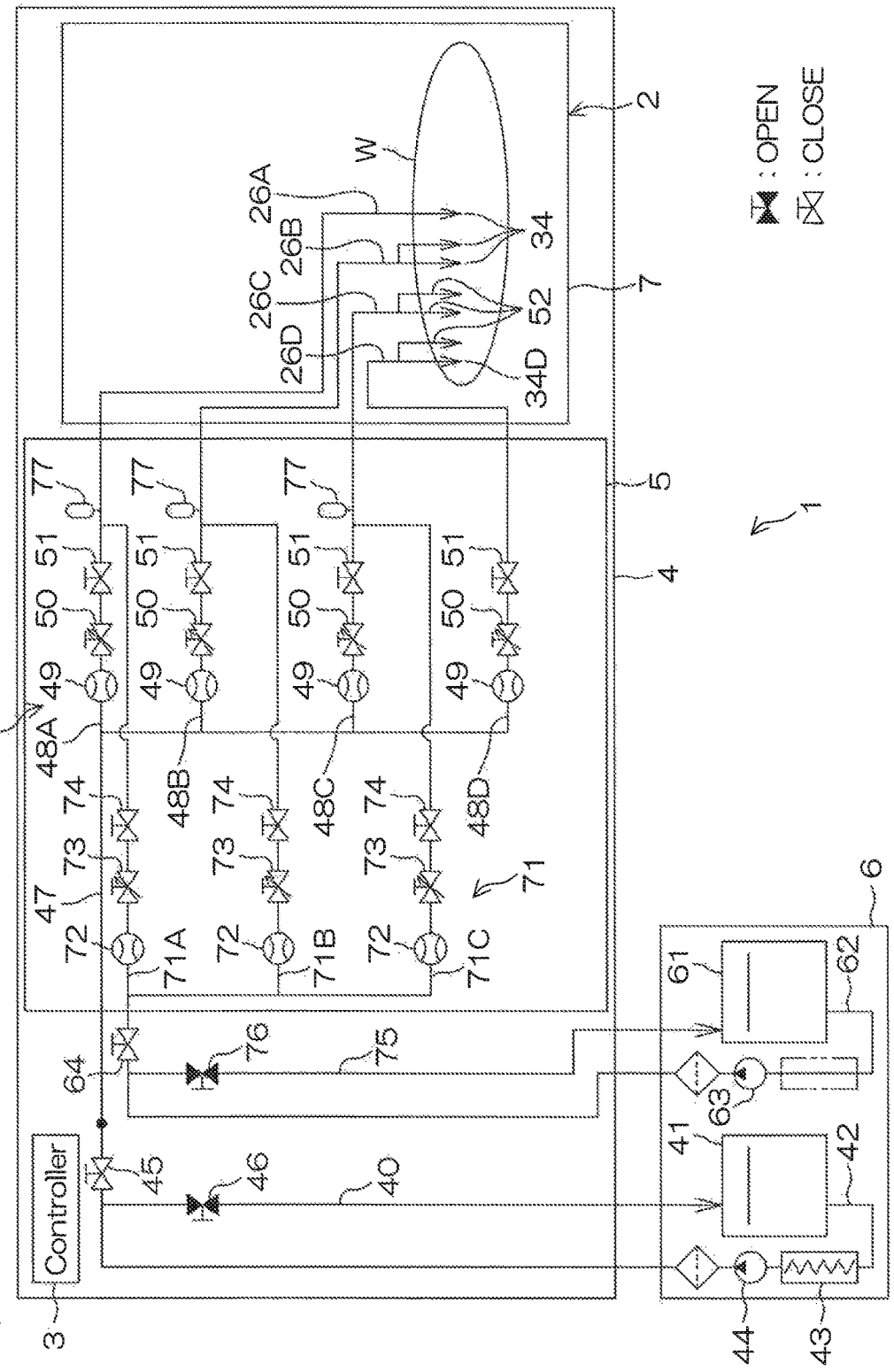
FIG. 14 Discharge stoppage state

SUBSTRATE PROCESSING APPARATUS

BACKGROUND OF THE INVENTION

1. Field of the Invention

The present invention relates to a substrate processing apparatus which processes a substrate. Substrates to be processed include, for example, semiconductor wafers, liquid crystal display device substrates, plasma display substrates, FED (Field Emission Display) substrates, optical disk substrates, magnetic disk substrates, magneto-optical disk substrates, photomask substrates, ceramic substrates, and photovoltaic cell substrates.

2. Description of Related Art

Japanese Patent Application Publication No. 2006-344907 discloses a single substrate processing type substrate processing apparatus that processes a substrate, such as a semiconductor wafer, etc., one by one. The substrate processing apparatus includes a spin chuck that rotates the substrate while holding the substrate horizontally and a nozzle that discharges a processing liquid of higher temperature than room temperature toward an upper surface central portion of the substrate held by the spin chuck. The high temperature processing liquid discharged from the nozzle lands on the upper surface central portion of the substrate and thereafter flows outward along the upper surface of the rotating substrate. The high temperature processing liquid is thereby supplied to an entire upper surface of the substrate.

The processing liquid that lands on the upper surface central portion of the rotating substrate flows from a central portion to a peripheral edge portion along the upper surface of the substrate. In this process, the temperature of the processing liquid decreases gradually. Temperature uniformity is thus decreased and processing uniformity is degraded. Although increasing a flow rate of the processing liquid discharged from the nozzle reduces the time taken for the processing liquid to reach the upper surface peripheral edge portion of the substrate and alleviates the lowering of the temperature of the processing liquid, in this case, the consumption amount of the processing liquid increases.

SUMMARY OF THE INVENTION

A preferred embodiment of the present invention provides a substrate processing apparatus including a substrate holding unit rotating a substrate around a vertical rotational axis passing through a central portion of the substrate while holding the substrate horizontally, and a processing liquid supplying system supplying the substrate held by the substrate holding unit with a processing liquid including a first liquid and a second liquid that generate heat upon mixing with each other.

The processing liquid supplying system includes a supply flow passage, a plurality of upstream flow passages, a plurality of component liquid flow passages, a plurality of discharge ports, and a mixing ratio changing unit. The supply flow passage guides the first liquid toward the plurality of upstream flow passages. The plurality of upstream flow passages branch from the supply flow passage and guide the first liquid supplied from the supply flow passage toward the plurality of discharge ports. The plurality of component liquid flow passages are respectively connected to the plurality of upstream flow passages and supply each of the plurality of upstream flow passages with the second liquid to be mixed with the first liquid. The plurality of discharge ports are respectively connected to the plurality of upstream flow passages at positions further downstream than the plurality of component liquid flow passages, and are respectively disposed at a plurality of positions differing in distance from the rotational axis, and respectively discharge the processing liquid including the first liquid and the second liquid mixed at the plurality of upstream flow passages toward a plurality of positions within an upper surface of the substrate including an upper surface central portion of the substrate. The mixing ratio changing unit independently changes mixing ratios of the first liquid and the second liquid included in the processing liquid to be discharged from the plurality of discharge ports for each of the upstream flow passages. Specific examples of the first liquid and the second liquid include a combination of sulfuric acid and hydrogen peroxide water and a combination of sulfuric acid and pure water.

With this arrangement, the supply flow passage guiding liquid branches into the plurality of upstream flow passages. The number of discharge ports can thereby be increased. The liquid flowing through the supply flow passage is supplied to the discharge ports via the upstream flow passages and discharged toward the upper surface of the substrate that rotates around the rotational axis. The plurality of discharge ports are respectively disposed at the plurality of positions differing in distance from the rotational axis. The temperature uniformity of the processing liquid on the substrate can thus be increased in comparison to a case where the processing liquid is discharged from just a single discharge port. The processing uniformity can thereby be increased while reducing the consumption amount of the processing liquid.

In a case where processing liquids are discharged from a plurality of discharge ports toward a plurality of positions that are separated in a radial direction, it is important, in terms of improvement of processing uniformity, that processing liquids of the same quality are supplied to the respective portions of the substrate. If a tank and a filter, etc., are provided for each discharge port, the processing liquid supplied to a certain discharge port may differ in quality from the processing liquid supplied to another discharge port. On the other hand, with the present preferred embodiment, the supply flow passage is branched so that first liquids supplied from the same flow passage (supply flow passage) are discharged from the respective discharge ports. First liquids of the same quality can thereby be discharged from the respective discharge ports. Further, in comparison to an arrangement where a tank and a filter, etc., are provided according to each discharge port, the number of parts can be reduced and maintenance work can be simplified.

If the processing liquid is higher in temperature than the substrate, the heat of the processing liquid is transferred from the processing liquid to the substrate. Also, since the processing liquid rotates together with the substrate, the processing liquid on the substrate flows outward along the upper surface of the substrate while being cooled by air. Circumferential speeds of respective portions of the substrate increase as the distance from the rotational axis increases. The processing liquid on the substrate is cooled more readily when the circumferential speed is higher. Also, if it is supposed that the upper surface of the substrate can be divided into a plurality of circular annular regions at equal intervals in a radial direction, the respective regions increase in area as the distance from the rotational axis increases. When the surface area increases, heat to be transferred from the processing liquid to a circular annular region increases. Therefore if the temperatures of the processing liquids discharged from the discharge ports are all the same, sufficient temperature uniformity may not be obtained.

With this arrangement, the first liquid supplied to the upstream flow passage from the supply flow passage is mixed with the second liquid supplied to the upstream flow passage from the component liquid flow passage. The first liquid and the second liquid generate heat when mixed with each other. Thus, the processing liquid is generated at the plurality of upstream flow passages and heated at the plurality of upstream flow passages. The mixing ratio changing unit independently changes mixing ratios of the first liquid and the second liquid included in the processing liquid to be discharged from the plurality of discharge ports for each of the upstream flow passages. Thus, the mixing ratio changing unit can cause the temperatures of the processing liquids supplied to the upper surface of the substrate to increase in a stepwise manner as the distance from the rotational axis increases. The temperature uniformity can thus be increased in comparison to a case where the processing liquid of the same temperature is discharged from each discharge port, and thereby the processing uniformity can be increased. The temperature uniformity can thus be increased in comparison to a case where the processing liquid of the same temperature is discharged from each discharge port, and thereby the processing uniformity can be increased.

In the present preferred embodiment, at least one of the following features may be added to the above substrate processing apparatus.

Downstream ends of the plurality of upstream flow passages are respectively disposed at a plurality of positions differing in distance from the rotational axis and, the mixing ratio changing unit independently changes the mixing ratios for each of the upstream flow passages such that mixing ratios of the first liquid and the second liquid approach a maximum mixing ratio at which a temperature of the processing liquid reaches its peak as a distance from the rotational axis to the upstream flow passage increases.

With this arrangement, the mixing ratios of the first liquid and the second liquid at the plurality of upstream flow passages approach the maximum mixing ratio as the distance from the rotational axis to the upstream flow passage increases. The maximum mixing ratio is a mixing ratio of the first liquid and the second liquid at which the temperature of the processing liquid is the maximum. Thus, the temperatures of the processing liquids at the plurality of discharge ports increase in a stepwise manner as the distance from the rotational axis increases. The temperature uniformity can thus be increased in comparison to a case where the processing liquid of the same temperature is discharged from each discharge port, and thereby the processing uniformity can be increased.

The mixing ratio changing unit independently changes the mixing ratios for each of the upstream flow passages such that temperatures of the processing liquids at the plurality of upstream flow passages increase as the distance from the rotational axis to the upstream flow passage increases. With this arrangement, similarly to the above, the temperature uniformity can be increased in comparison to a case where the processing liquid of the same temperature is discharged from each discharge port, and thereby the processing uniformity can be increased.

The mixing ratio changing unit includes at least one of a plurality of first flow control valves and a plurality of second flow control valves, and the first flow control valves are respectively connected to the plurality of upstream flow passages at positions further upstream than the plurality of component liquid flow passages and independently change flow rates of the first liquids to be mixed with the second liquid for each of the upstream flow passages, and the second flow control valves are respectively connected to the plurality of component liquid flow passages and independently change flow rates of the second liquids to be mixed with the first liquid for each of the component liquid flow passages. The mixing ratio changing unit may include both of the plurality of first flow control valves and the plurality of second flow control valves, and may include only one of the plurality of first flow control valves and the plurality of second flow control valves.

The processing liquid supplying system further includes a plurality of downstream flow passages, and the plurality of discharge ports include a main discharge port discharging the processing liquid toward the upper surface central portion of the substrate and a plurality of auxiliary discharge ports discharging the processing liquid toward a plurality of positions within the upper surface of the substrate, the plurality of positions being away from the upper surface central portion and differing in distance from the rotational axis, and the plurality of upstream flow passages include a main upstream flow passage connected to the main discharge port and a plurality of auxiliary upstream flow passages connected to the plurality of auxiliary discharge ports via the plurality of downstream flow passages, and each of the plurality of auxiliary upstream flow passages is a branching upstream flow passage that branches into a plurality of the downstream flow passages and each auxiliary discharge port is respectively provided according to each downstream flow passage.

With this arrangement, the flow passages supplying the processing liquids to the plurality of discharge ports are branched into multiple stages. That is, the supply flow passage branches into the plurality of upstream flow passages (first branching) and the branching upstream flow passages, included among the plurality of upstream flow passages, branch into the plurality of downstream flow passages (second branching). The number of discharge ports can thus be increased in comparison to a case where the branching upstream flow passages are not included among the plurality of upstream flow passages. The temperature uniformity of the processing liquid on the substrate can thereby be increased further and the processing uniformity can be increased further.

The substrate processing apparatus further includes a chamber housing the substrate held by the substrate holding unit and the branching upstream flow passages branch into the plurality of downstream flow passages inside the chamber.

With this arrangement, upstream ends of the plurality of downstream flow passages are disposed inside the chamber. The branching upstream flow passages branch into the plurality of downstream flow passages inside the chamber. Each downstream flow passage can thus be reduced in length (length in a direction in which the liquid flows) in comparison to a case where the branching upstream flow passages are branched outside the chamber. Temperature decrease of the processing liquid due to heat transfer from the processing liquid to each downstream flow passage can thereby be suppressed.

The processing liquid supplying system further includes an upstream heater and a plurality of downstream heaters, and the upstream heater heats the first liquid to be supplied to the supply flow passage at an upstream temperature, and the plurality of discharge ports include a main discharge port discharging the processing liquid toward the upper surface central portion of the substrate, and a plurality of auxiliary discharge ports discharging the processing liquid toward a plurality of positions within the upper surface of the substrate, the plurality of positions being away from the upper surface central portion and differing in distance from the rotational axis, and the plurality of upstream flow passages include a main upstream flow passage connected to the main discharge port and a plurality of auxiliary upstream flow passages connected to the plurality of auxiliary discharge ports, and the plurality of downstream heaters are respectively connected to the plurality of auxiliary upstream flow passages, and heat the processing liquids flowing through the plurality of auxiliary upstream flow passages at a downstream temperature higher than the upstream temperature.

With this arrangement, the processing liquid of higher temperature than the upstream temperature at which the upstream heater heats the processing liquid is supplied to the plurality of auxiliary discharge ports from the plurality of auxiliary upstream flow passages and is discharged from the discharge ports. That is, whereas the processing liquid of the upstream temperature is discharged from the main discharge port, the processing liquid of higher temperature than the upstream temperature is discharged from each of the plurality of auxiliary discharge ports. Since the temperatures of the processing liquids supplied to the upper surface of the substrate increase stepwise as the distance from the rotational axis increases, the temperature uniformity of the processing liquid on the substrate can thus be increased in comparison to a case where the processing liquid of the same temperature is discharged from each discharge port. The processing uniformity can thereby be increased while reducing the consumption amount of the processing liquid.

The processing liquid supplying system further includes a first nozzle and a second nozzle, the plurality of discharge ports include a first discharge port, disposed in the first nozzle, and a second discharge port, disposed in the second nozzle, and are aligned in a radial direction orthogonal to the rotational axis in a plan view, the first nozzle includes a first arm portion extending in a horizontal longitudinal direction and a first tip portion extending downward from a tip of the first arm portion, the second nozzle includes a second arm portion extending in the longitudinal direction and a second tip portion extending downward from a tip of the second arm portion, the first arm portion and the second arm portion are aligned in a horizontal alignment direction orthogonal to the longitudinal direction, and the tip of the first arm portion and the tip of the second arm portion are separated in the longitudinal direction in a plan view such that the tip of the first arm portion is positioned at the rotational axis side.

With this arrangement, the plurality of discharge ports are aligned in the radial direction in a plan view. When a plurality of nozzles of the same length are aligned in the horizontal direction orthogonal to the longitudinal direction so that the plurality of discharge ports are aligned in the radial direction in a plan view, an entirety of the plurality of nozzles increases in width (see FIG. 9). When a plurality of nozzles of different lengths are aligned in a vertical direction so that the plurality of discharge ports are aligned in the radial direction in a plan view, the entirety of the plurality of nozzles increases in height (see FIG. 10A and FIG. 10B).

On the other hand, when the first arm portion and the second arm portion are aligned in the horizontal alignment direction orthogonal to the longitudinal direction and the tip of the first arm portion and the tip of the second arm portion are shifted in the longitudinal direction in a plan view such that the tip of the first arm portion is positioned at the rotational axis side, the plurality of discharge ports can be aligned in the radial direction in a plan view while suppressing both the width and the height of the entirety of the plurality of nozzles (see FIG. 4). The plurality of nozzles and associated members, such as a standby pot, etc., can thereby be made compact.

Another preferred embodiment of the present invention provides a substrate processing apparatus including a substrate holding unit rotating a substrate around a vertical rotational axis passing through a central portion of the substrate while holding the substrate horizontally, and a processing liquid supplying system supplying a processing liquid to the substrate held by the substrate holding unit.

The processing liquid supplying system include an upstream heater, a supply flow passage, a plurality of upstream flow passages, a plurality of discharge ports, and a plurality of downstream heaters. The upstream heater heats the processing liquid to be supplied to the supply flow passage at an upstream temperature. The supply flow passage guides the processing liquid toward the plurality of upstream flow passages. The plurality of upstream flow passages branch from the supply flow passage and guide the processing liquids supplied from the supply flow passage toward the plurality of discharge ports. The plurality of discharge ports include a main discharge port discharging the processing liquid toward an upper surface central portion of the substrate and a plurality of auxiliary discharge ports discharging the processing liquid toward a plurality of positions within an upper surface of the substrate, the plurality of positions being away from the upper surface central portion and differing in distance from the rotational axis, and are respectively disposed at a plurality of positions differing in distance from the rotational axis, and respectively discharge the processing liquid supplied via the plurality of upstream flow passages toward the upper surface of the substrate held by the substrate holding unit. The plurality of upstream flow passages include a main upstream flow passage connected to the main discharge port and a plurality of auxiliary upstream flow passages connected to the plurality of auxiliary discharge ports. The plurality of downstream heaters are respectively connected to the plurality of auxiliary upstream flow passages at positions further upstream than the plurality of auxiliary discharge ports, and heat the processing liquids flowing through the plurality of auxiliary upstream flow passages at a downstream temperature higher than the upstream temperature.

With this arrangement, the supply flow passage guiding the processing liquid branches into the plurality of upstream flow passages. The number of discharge ports can thereby be increased. The processing liquid flowing through the supply flow passage is supplied to the discharge ports from the upstream flow passages and discharged toward the upper surface of the substrate that rotates around the rotational axis. The plurality of discharge ports are respectively disposed at the plurality of positions differing in distance from the rotational axis. The temperature uniformity of the processing liquid on the substrate can thus be increased in comparison to a case where the processing liquid is discharged from just a single discharge port. The processing uniformity can thereby be increased while reducing the consumption amount of the processing liquid.

In a case where processing liquids are discharged from a plurality of discharge ports toward a plurality of positions that are separated in a radial direction, it is important, in terms of improvement of processing uniformity, that processing liquids of the same quality are supplied to the respective portions of the substrate. If a tank and a filter, etc., are provided for each discharge port, the processing liquid supplied to a certain discharge port may differ in quality from the processing liquid supplied to another discharge port. On the other hand, with the present preferred embodiment, the supply flow passage is branched so that the processing liquids supplied from the same flow passage (supply flow passage) are discharged from the respective discharge ports. Processing liquids of the same quality can thereby be discharged from the respective discharge ports. Further, in comparison to an arrangement where a tank and a filter, etc., are provided according to each discharge port, the number of parts can be reduced and maintenance work can be simplified.

With this arrangement, the processing liquids that have been heated at the downstream temperatures higher than the upstream temperature by the downstream heaters are supplied to the plurality of auxiliary discharge ports from the plurality of auxiliary upstream flow passages and are discharged from the discharge ports. That is, whereas the processing liquid of the upstream temperature is discharged from the main discharge port, the processing liquid of higher temperature than the upstream temperature is discharged from each of the plurality of auxiliary discharge ports. Since the temperatures of the processing liquids supplied to the upper surface of the substrate increase stepwise as the distance from the rotational axis increases, the temperature uniformity of the processing liquid on the substrate can thus be increased in comparison to a case where the processing liquid of the same temperature is discharged from each discharge port. The processing uniformity can thereby be increased while reducing the consumption amount of the processing liquid.

Another preferred embodiment of the present invention provides a substrate processing apparatus including a substrate holding unit rotating a substrate around a vertical rotational axis passing through a central portion of the substrate while holding the substrate horizontally, and a processing liquid supplying system supplying a processing liquid to the substrate held by the substrate holding unit.

The processing liquid supplying system includes an upstream heater, a supply flow passage, a plurality of upstream flow passages, a plurality of discharge ports, and a plurality of low-temperature liquid flow passages. The upstream heater heats a high-temperature liquid to be supplied to the supply flow passage. The supply flow passage guides the high-temperature liquid toward the plurality of upstream flow passages. The plurality of upstream flow passages include an outer upstream flow passage and a plurality of inner upstream flow passages, and branch from the supply flow passage, and guide the high-temperature liquid supplied from the supply flow passage toward the plurality of discharge ports. The plurality of discharge ports include an outer discharge port that is connected to the outer upstream flow passage and discharges the processing liquid toward an upper surface peripheral edge portion of the substrate and a plurality of inner discharge ports that are connected to the plurality of inner upstream flow passages and respectively discharge the processing liquid toward a plurality of positions inside the upper surface peripheral edge portion and within an upper surface of the substrate, and are respectively disposed at positions differing in distance from the rotational axis, and discharge the processing liquid supplied via the plurality of upstream flow passages toward the upper surface of the substrate. The plurality of low-temperature liquid flow passages are respectively connected to the plurality of inner upstream flow passages at positions further upstream than the plurality of inner discharge ports, and guide a low-temperature liquid, that is a liquid of the same type as the high-temperature liquid flowing through the supply flow passage and lower in temperature than the high-temperature liquid, toward the plurality of inner upstream flow passages.

With this arrangement, the supply flow passage guiding the processing liquid branches into the plurality of upstream flow passages. The number of discharge ports can thereby be increased. The processing liquid flowing through the supply flow passage is supplied to the discharge ports via the upstream flow passages and discharged toward the upper surface of the substrate that rotates around the rotational axis. The plurality of discharge ports are respectively disposed at the plurality of positions differing in distance from the rotational axis. The temperature uniformity of the processing liquid on the substrate can thus be increased in comparison to a case where the processing liquid is discharged from just a single discharge port. The processing uniformity can thereby be increased while reducing the consumption amount of the processing liquid.

If the processing liquid is higher in temperature than the substrate, the heat of the processing liquid is transferred from the processing liquid to the substrate. Also, since the processing liquid rotates together with the substrate, the processing liquid on the substrate flows outward along the upper surface of the substrate while being cooled by air. Circumferential speeds of respective portions of the substrate increase as the distance from the rotational axis increases. The processing liquid on the substrate is cooled more readily when the circumferential speed is higher. Also, if it is supposed that the upper surface of the substrate can be divided into a plurality of circular annular regions at equal intervals in a radial direction, the respective regions increase in area as the distance from the rotational axis increases. When the surface area increases, heat to be transferred from the processing liquid to a circular annular region increases. Therefore if the temperatures of the processing liquids discharged from the discharge ports are all the same, sufficient temperature uniformity may not be obtained.

With this arrangement, the low-temperature liquid is supplied to the plurality of inner upstream flow passages and mixed with the high-temperature flowing liquid through these inner upstream flow passages. The low-temperature liquid is a liquid of the same type as the high-temperature liquid and lower in temperature than the high-temperature liquid. Thus, whereas the high-temperature liquid is discharged from the outermost discharge port, a liquid (mixed liquid of the high-temperature liquid and the low-temperature liquid) lower in temperature than the high-temperature liquid is discharged from the plurality of inner discharge ports. The temperatures of the processing liquids supplied to the upper surface of the substrate thus increase stepwise with distance away from the rotational axis. Thus, the temperature uniformity of the processing liquid on the substrate can thus be increased in comparison to a case where the processing liquid of the same temperature is discharged from each discharge port. The processing uniformity can thus be increased while reducing the consumption amount of the processing liquid.

In the present preferred embodiment, at least one of the following features may be added to the above substrate processing apparatus.

The processing liquid supplying system further includes a plurality of temperature sensors and a mixing ratio changing unit, and the plurality of temperature sensors are respectively connected to the plurality of inner upstream flow passages, and detect temperatures of liquids at the plurality of inner upstream flow passages, and the mixing ratio changing unit independently changes mixing ratios of the high-temperature liquid and the low-temperature liquid to be mixed with each other at the plurality of inner upstream flow passages for each of the inner upstream flow passages.

With this arrangement, temperatures of liquids flowing through the plurality of inner upstream flow passages are detected by the plurality of temperature sensors at each of the inner upstream flow passages. The mixing ratio changing unit independently changes the mixing ratios of the high-temperature liquid and the low-temperature liquid to be mixed with each other at the plurality of inner upstream flow passages for each of the inner upstream flow passages based on detected values of the plurality of temperature sensors. Thus, the temperatures of the mixed liquids supplied to the plurality of inner discharge ports from the plurality of inner upstream flow passages can be approximated to preset temperatures more precisely.

The mixing ratio changing unit includes at least one of a plurality of first flow control valves and a plurality of second flow control valves, and the first flow control valves are respectively connected to the plurality of inner upstream flow passages at positions further upstream than the plurality of low-temperature liquid flow passages and independently change flow rates of the high-temperature liquids to be mixed with the low-temperature liquid for each of the inner upstream flow passages, and the second flow control valves are respectively connected to the plurality of low-temperature liquid flow passages and independently change flow rates of the low-temperature liquids to be mixed with the high-temperature liquid for each of the low-temperature liquid flow passages.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 13 is a schematic view of a processing liquid supplying system of a substrate processing apparatus according to a third preferred embodiment of the present invention and shows the processing liquid supplying system in a discharging state.

FIG. 14 is a schematic view of the processing liquid supplying system of the substrate processing apparatus according to the third preferred embodiment of the present invention and shows the processing liquid supplying system in a discharge stoppage state.

DETAILED DESCRIPTION OF PREFERRED EMBODIMENTS

Figure 1:
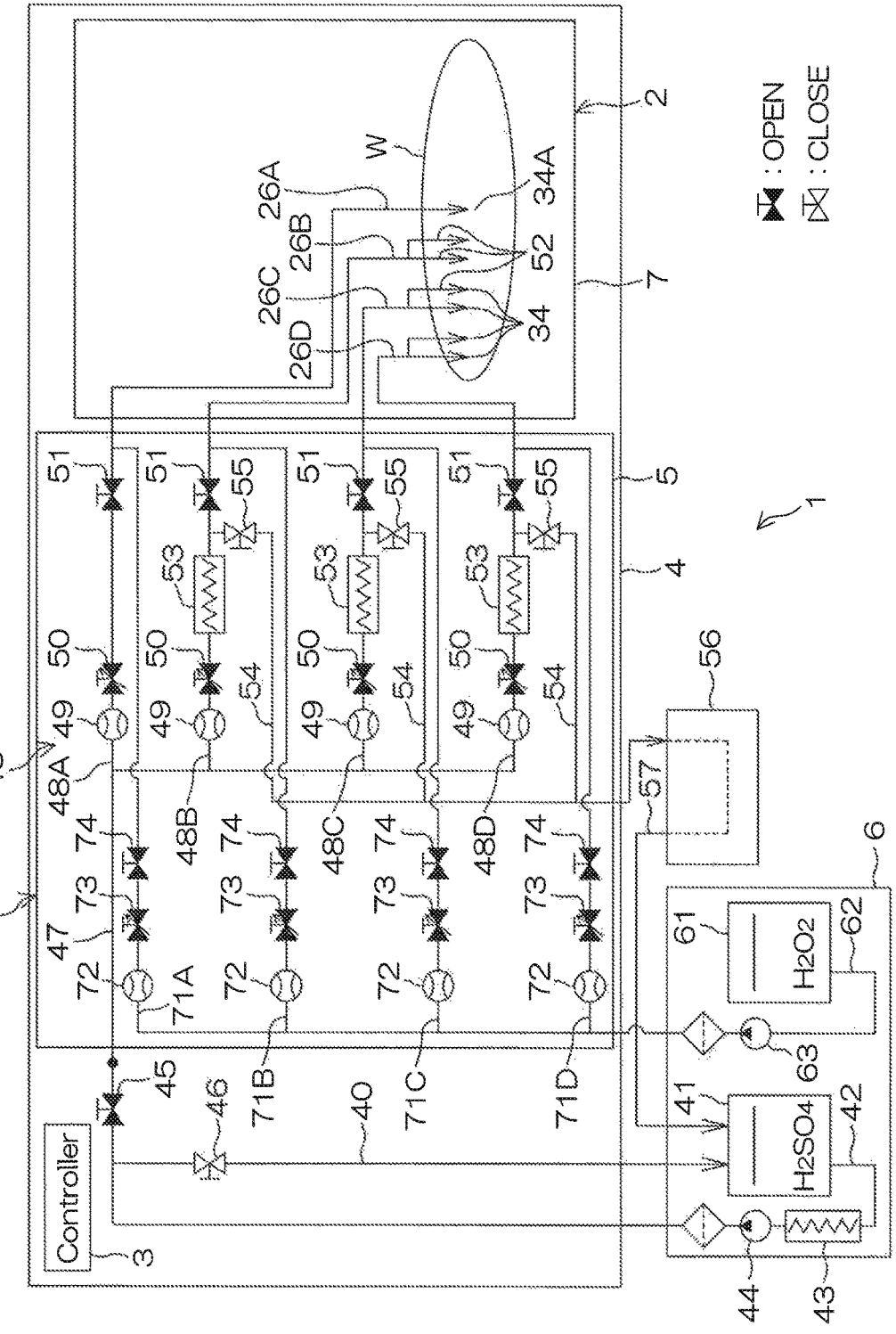
FIG. 1 is a schematic view of a processing liquid supplying system of a substrate processing apparatus according to a first preferred embodiment of the present invention and shows the processing liquid supplying system in a discharging state.
Figure 2:
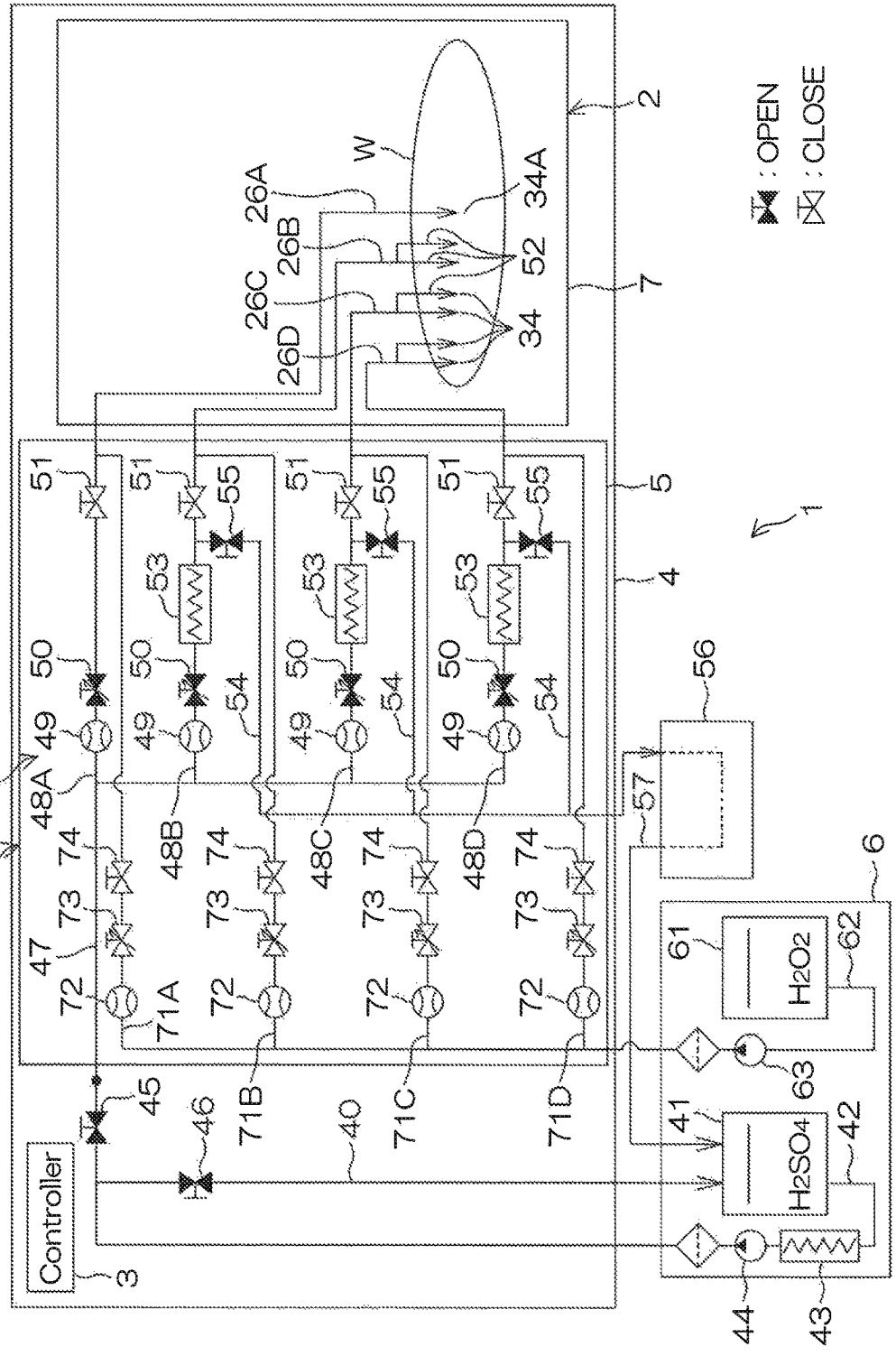
FIG. 2 is a schematic view of a processing liquid supplying system of the substrate processing apparatus according to the first preferred embodiment of the present invention and shows the processing liquid supplying system in a discharge stoppage state.

FIG. 1 and FIG. 2 are schematic views of a processing liquid supplying system of a substrate processing apparatus 1 according to a preferred embodiment of the present invention. FIG. 1 shows the processing liquid supplying system in a discharging state and FIG. 2 shows the processing liquid supplying system in a discharge stoppage state.

The substrate processing apparatus 1 is a single substrate processing type apparatus that processes a disk-shaped substrate W, such as a semiconductor wafer, etc., one by one. The substrate processing apparatus 1 includes a processing unit 2 that processes the substrate W with a processing liquid, a transfer robot (not shown) that conveys the substrate W to the processing unit 2, and a controller 3 that controls the substrate processing apparatus 1. The controller 3 is a computer that includes a computing portion and a storage portion.

The substrate processing apparatus 1 includes a plurality of fluid boxes 5, each housing fluid devices including a valve 51 that controls supplying of the processing liquid to the processing unit 2 and its stoppage, and a plurality of storage boxes 6, each housing a tank 41 storing the processing liquid to be supplied to the processing unit 2 via the fluid boxes 5. The processing unit 2 and the fluid boxes 5 are disposed inside a frame 4 of the substrate processing apparatus 1. A chamber 7 of the processing unit 2 and the fluid boxes 5 are aligned in a horizontal direction. The storage boxes 6 are disposed outside the frame 4. The storages boxes 6 may be disposed inside the frame 4.

Figure 3:
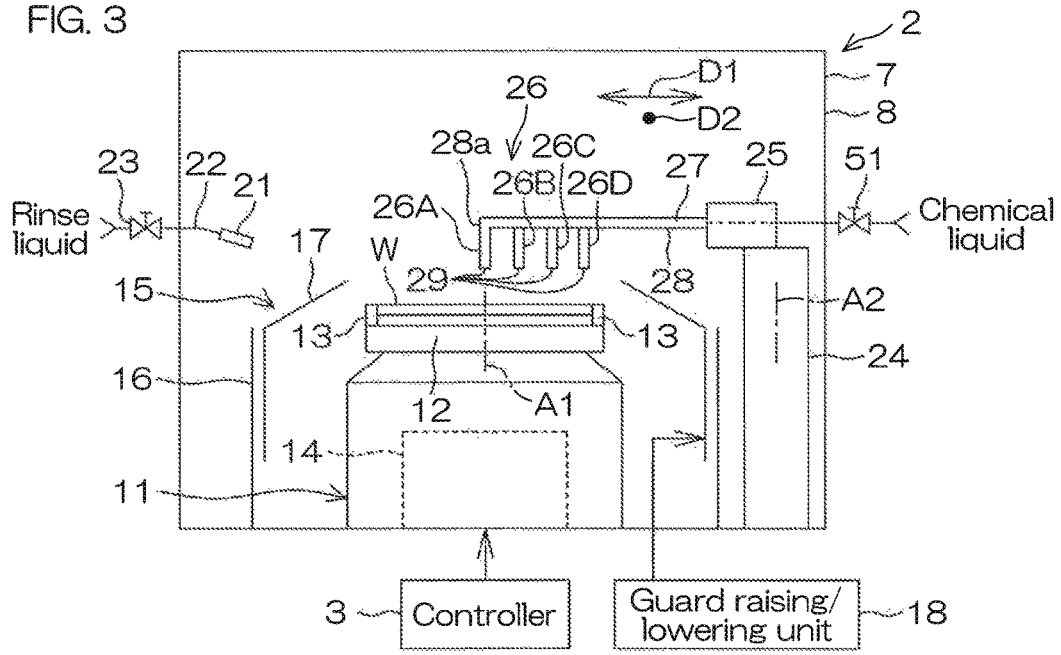
FIG. 3 is a schematic front view of an interior of a processing unit included in the substrate processing apparatus.
Figure 4:
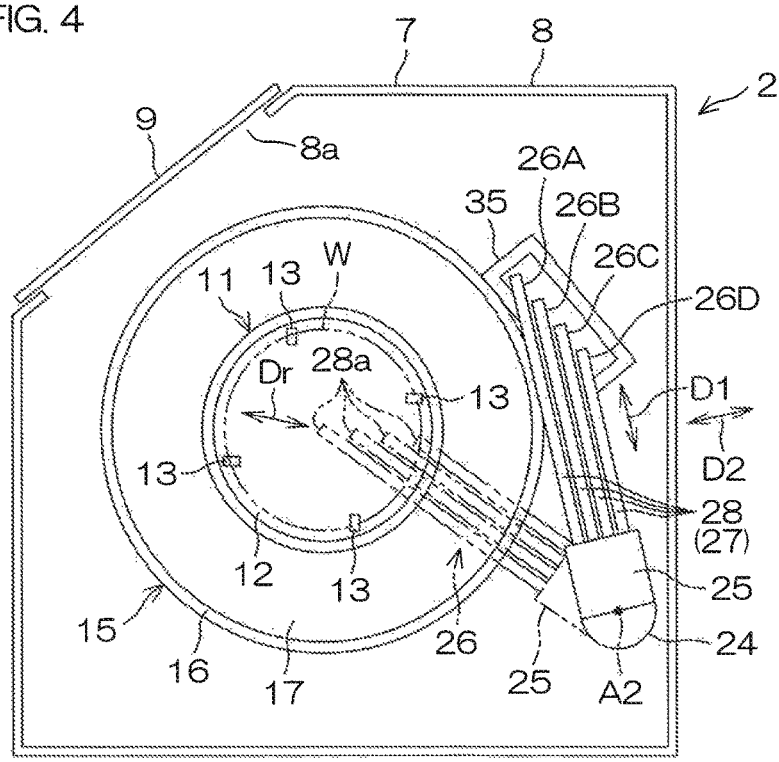
FIG. 4 is a schematic plan view of the interior of the processing unit included in the substrate processing apparatus.

FIG. 3 is a schematic front view of an interior of the processing unit 2. FIG. 4 is a schematic plan view of the interior of the processing unit 2.

As shown in FIG. 3, the processing unit 2 includes a box-shaped chamber 7, a spin chuck 11 rotating the substrate W around a vertical rotational axis A1 passing through a central portion of the substrate W while holding the substrate W horizontally inside the chamber 7, and a cylindrical cup 15 receiving the processing liquid expelled from the substrate W.

As shown in FIG. 4, the chamber 7 includes a box-shaped partition wall 8, provided with a carry-in/carry-out port 8a through which the substrate W passes, and a shutter 9 that opens and closes the carry-in/carry-out port 8a. The shutter 9 is movable with respect to the partition wall 8 between an open position at which the carry-in/carry-out port 8a is open and a closed position (position shown in FIG. 4) at which the carry-in/carry-out port 8a is closed. The unillustrated transfer robot carries the substrate W into the chamber 7 through the carry-in/carry-out port 8a and carries out the substrate W from the chamber 7 through the carry-in/carry-out port 8a.

As shown in FIG. 3, the spin chuck 11 includes a disk-shaped spin base 12 that is held in a horizontal orientation, a plurality of chuck pins 13 that hold the substrate W in a horizontal orientation above the spin base 12, and a spin motor 14 that rotates the plurality of chuck pins 13 to rotate the substrate W around a rotational axis A1. The spin chuck 11 is not restricted to a clamping type chuck in which the plurality of chuck pins 13 are brought into contact with a peripheral end surface of the substrate W, and may be a vacuum type chuck in which a rear surface (lower surface) of the substrate W that is a non-device forming surface is suctioned onto an upper surface of the spin base 12 to hold the substrate horizontally.

As shown in FIG. 3, the cup 15 includes a cylindrical splash guard 17 that surrounds the spin chuck 11 around the rotational axis A1 and a circular cylindrical outer wall 16 surrounding the splash guard 17 around the rotational axis A1. The processing unit 2 includes a guard raising/lowering unit 18 that raises and lowers the splash guard 17 vertically between an upper position (position shown in FIG. 3) at which an upper end of the splash guard 17 is positioned higher than a position at which the spin chuck 11 holds the substrate W and a lower position at which the upper end of the splash guard 17 is positioned lower than the position at which the spin chuck 11 holds the substrate W.

As shown in FIG. 3, the processing unit 2 includes a rinse liquid nozzle 21 that discharges a rinse liquid downward toward an upper surface of the substrate W held by the spin chuck 11. The rinse liquid nozzle 21 is connected to a rinse liquid piping 22 in which a rinse liquid valve 23 is interposed. The processing unit 2 may include a nozzle moving unit that moves the rinse liquid nozzle 21 between a processing position and a standby position.

When the rinse liquid valve 23 is opened, the rinse liquid is supplied from the rinse liquid piping 22 to the rinse liquid nozzle 21 and discharged from the rinse liquid nozzle 21. The rinse liquid is, for example, pure water (deionized water). The rinse liquid is not restricted to pure water and may instead be any of carbonated water, electrolyzed ion water, hydrogen water, ozone water, or aqueous hydrochloric acid solution of dilute concentration (of, for example, approximately 10 to 100 ppm), etc.

As shown in FIG. 4, the processing unit 2 includes a plurality of nozzles 26 (first nozzle 26A, second nozzle 26B, third nozzle 26C, and fourth nozzle 26D) that discharge chemical liquids downward, a holder 25 that holds each of the plurality of nozzles 26, and a nozzle moving unit 24 that moves the holder 25 to move the plurality of nozzles 26 between a processing position (position indicated by alternate long and two short dashes lines in FIG. 4) and a standby position (position indicated by solid lines in FIG. 4).

Representative examples of the chemical liquid include etching liquids, such as TMAH (tetramethylammonium hydroxide aqueous solution), etc., and resist removing liquids, such as SPM (sulfuric acid/hydrogen peroxide mixture), etc. The chemical liquid is not restricted to TMAH and SPM, and may be a liquid containing at least one of sulfuric acid, acetic acid, nitric acid, hydrochloric acid, hydrofluoric acid, ammonia water, hydrogen peroxide water, an organic acid (for example, citric acid, oxalic acid, etc.), an organic alkali besides TMAH, a surfactant, and a corrosion inhibitor.

As shown in FIG. 3, each of the nozzles 26 includes a main nozzle body 27 that is cantilevered by the holder 25. The main nozzle body 27 includes an arm portion 28 extending in a horizontal longitudinal direction D1 from the holder 25 and a tip portion 29 extending downward from a tip 28a of the arm portion 28. The tip 28a of the arm portion 28 means a portion disposed furthest in the longitudinal direction D1 from the holder 25 in a plan view.

As shown in FIG. 4, the plurality of arm portions 28 are aligned in a horizontal alignment direction D2, orthogonal to the longitudinal direction D1, in the order of the first nozzle 26A to the fourth nozzle 26D. The plurality of arm portions 28 are disposed at the same height. An interval between two arm portions 28 that are adjacent in the alignment direction D2 may be the same as any of the other intervals or may differ from at least one of the other intervals. FIG. 4 shows an example where the plurality of arm portions 28 are disposed at equal intervals.

Lengths of the plurality of arm portions 28 in the longitudinal direction D1 decrease in the order of the first nozzle 26A to the fourth nozzle 26D. Tips of the plurality of nozzles 26 (the tips 28a of the plurality of arm portions 28) are shifted in the longitudinal direction D1 so as to be aligned in the order of the first nozzle 26A to the fourth nozzle 26D in regard to the longitudinal direction D1. The tips of the plurality of nozzles 26 are aligned rectilinearly in a plan view.

The nozzle moving unit 24 makes the holder 25 pivot around a nozzle pivoting axis A2 extending vertically at a periphery of the cup 15 to move the plurality of nozzles 26 along an arcuate path passing the substrate W in a plan view. The plurality of nozzles 26 are thereby moved horizontally between the processing position and the standby position. The processing unit 2 includes a bottomed cylindrical standby pot 35 that is disposed below the standby position of the plurality of nozzles 26. The standby pot 35 is disposed at a periphery of the cup 15 in a plan view.

The processing position is a position at which the chemical liquids discharged from the plurality of nozzles 26 land on the upper surface of the substrate W. At the processing position, the plurality of nozzles 26 and the substrate W overlap in a plan view and the tips of the plurality of nozzles 26 are aligned in a radial direction Dr in the order of the first nozzle 26A to the fourth nozzle 26D from the rotational axis A1 side. In this state, the tip of the first nozzle 26A overlaps with a central portion of the substrate W in a plan view and the tip of the fourth nozzle 26D overlaps with a peripheral edge portion of the substrate W in a plan view.

The standby position is a position to which the plurality of nozzles 26 are retracted so that the plurality of nozzles 26 and the substrate W do not overlap in a plan view. At the standby position, the tips of the plurality of nozzles 26, in a plan view, are positioned outside the cup 15 and along an outer circumferential surface of the cup 15 (outer circumferential surface of the outer wall 16) and are aligned in a circumferential direction (direction around the rotational axis A1) in the order of the first nozzle 26A to the fourth nozzle 26D. The plurality of nozzles 26 are disposed so as to move away from the rotational axis A1 in the order of the first nozzle 26A to the fourth nozzle 26D.

The plurality of nozzles 26 shall now be described with reference to FIG. 5 and FIG. 6. Thereafter, the processing liquid supplying system shall be described.

In the following description, "first" and "A" may be added to the beginning and the end of an arrangement corresponding to the first nozzle 26A. For example, an upstream flow passage 48 associated with the first nozzle 26A may be referred to as the "first upstream flow passage 48A." The same applies to arrangements associated with the second nozzle 26B to the fourth nozzle 26D.

Also in the following description, a temperature at which the processing liquid is heated by an upstream heater 43 may be referred to as the "upstream temperature" and a temperature at which the processing liquid is heated by a downstream heater 53 may be referred to as the "downstream temperature." Temperatures at which the processing liquids are heated by a second downstream heater 53 to a fourth downstream heater 53 may be referred to respectively as the "second downstream temperature" to the "fourth heating temperature."

Figure 5:
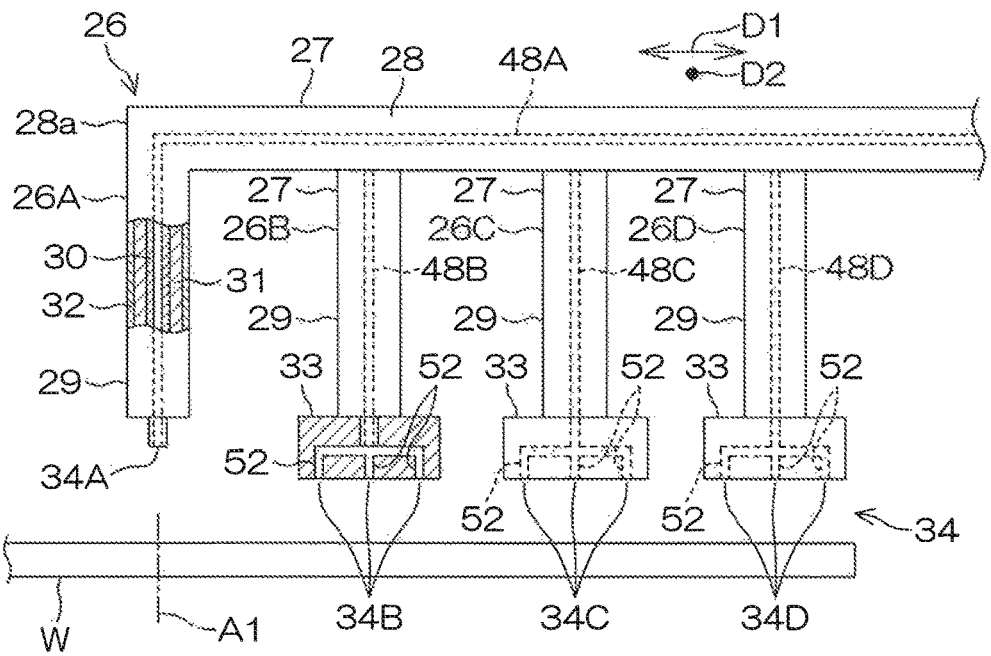
FIG. 5 is a schematic front view of a plurality of nozzles.

As shown in FIG. 5, each main nozzle body 27 includes a resin tube 30 that guides the processing liquid, a core bar 31 including cylindrical cross section that surrounds the resin tube 30, and a resin coating 32 including cylindrical cross section that surrounds an outer surface of the core bar 31. Each of the nozzles 26 besides the first nozzle 26A further includes a nozzle head 33 mounted on the tip portion 29 of the main nozzle body 27.

Each main nozzle body 27 defines a single flow passage extending along the main nozzle body 27. Each nozzle head 33 defines a plurality of flow passages guiding the processing liquid supplied from the main nozzle body 27. The flow passage of the main nozzle body 27 defines a discharge port 34 opening at an outer surface of the main nozzle body 27. The plurality of flow passages of the nozzle head 33 define a plurality of discharge ports 34 opening at an outer surface of the nozzle head 33. The flow passage of the main nozzle body 27 corresponds to a portion of an upstream flow passage 48 to be described below. Each of the flow passages of the nozzle head 33 corresponds to a downstream flow passage 52 to be described below. Downstream ends of the first upstream flow passage 48A to the fourth upstream flow passage 48D are respectively disposed at a plurality of positions differing in distance from the rotational axis A1.

Figure 6:
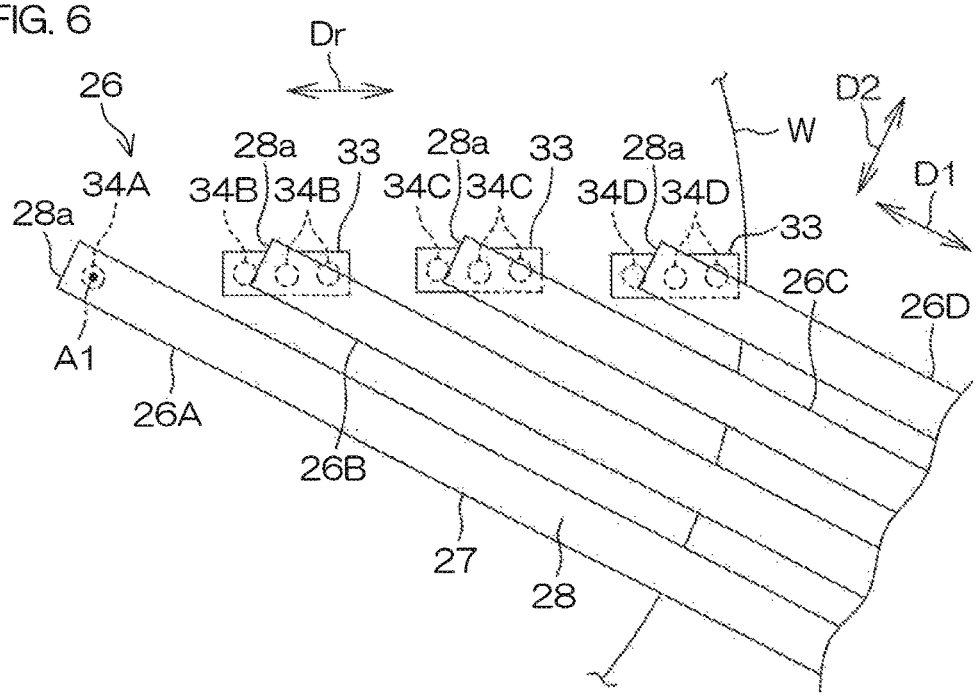
FIG. 6 is a schematic plan view of the plurality of nozzles.

FIG. 5 and FIG. 6 show an example where the total number of discharge ports 34 disposed in the plurality of nozzles 26 is ten. The first nozzle 26A includes a single discharge port 34 disposed in the main nozzle body 27. Each of the nozzles 26 besides the first nozzle 26A includes three discharge ports 34 disposed in the nozzle head 33. The three discharge ports 34 disposed in the same nozzle head 33 are constituted of an inner discharge port that is closest to the rotational axis A1 among the three discharge ports 34, an outer discharge port that is furthest from the rotational axis A1 among the three discharge ports 34, and a middle discharge port disposed between the inner discharge port and the outer discharge port.

As shown in FIG. 6, the plurality of discharge ports 34 are aligned rectilinearly in a plan view. An interval between the two discharge ports 34 at the respective ends is not more than a radius of the substrate W. An interval between two discharge ports 34 that are adjacent may be the same as any of the other intervals or may differ from at least one of the other intervals. Also, the plurality of discharge ports 34 may be disposed at the same height or may be disposed at two or more different heights.

When the plurality of nozzles 26 are disposed at the processing position, the plurality of discharge ports 34 are respectively disposed at a plurality of positions that differ in distance (shortest distance in a plan view) from the rotational axis A1. In this state, an innermost discharge port (first discharge port 34A) that is closest to the rotational axis A1 among the plurality of discharge ports 34 is disposed above a central portion of the substrate W, and an outermost discharge port (fourth discharge port 34D) that is furthest from the rotational axis A1 among the plurality of discharge ports 34 is disposed above a peripheral edge portion of the substrate W, The plurality of discharge ports 34 are aligned in the radial direction Dr in a plan view.

The first discharge port 34A disposed in the first nozzle 26A is a main discharge port that discharges the processing liquid toward an upper surface central portion of the substrate W. The second discharge port 34B to the fourth discharge port 34D that are disposed in the respective nozzles 26 besides the first nozzle 26A are a plurality of auxiliary discharge ports that discharge the processing liquids toward a portion of the upper surface of the substrate W besides the central portion. The first upstream flow passage 48A connected to the first discharge port 34A is a main upstream flow passage and the second upstream flow passage 48B to the fourth upstream flow passage 48D that are connected to the second discharge port 34B to the fourth discharge port 34D are a plurality of auxiliary upstream flow passages.

As shown in FIG. 5, each discharge port 34 discharges the chemical liquid in a discharge direction perpendicular to the upper surface of the substrate W. The plurality of discharge ports 34 discharge the chemical liquids toward a plurality of liquid landing positions within the upper surface of the substrate W. The plurality of liquid landing positions are separate positions that differ in distance from the rotational axis A1. If the liquid landing position that is closest to the rotational axis A1 among the plurality of liquid landing positions is referred to as the "first liquid landing position" and the liquid landing position that is second closest to the rotational axis A1 among the plurality of liquid landing positions is referred to as the "second liquid landing position," the chemical liquid discharged from the first discharge port 34A lands on the first liquid landing position and the chemical liquid discharged from the second discharge port 34B lands on the second liquid landing position.

The processing liquid supplying system shall now be described in detail with reference to FIG. 1 and FIG. 2.

The processing liquid supplying system includes a first chemical liquid tank 41 storing sulfuric acid serving as first chemical liquid. The processing liquid supplying system further includes a first chemical liquid flow passage 42 guiding the sulfuric acid fed from first chemical liquid tank 41, a first upstream heater 43 heating the sulfuric acid flowing inside the first chemical liquid flow passage 42 at the upstream temperature higher than room temperature (for example, of 20 to 30° C.) to adjust the temperature of the sulfuric acid inside the first chemical liquid tank 41, a first pump 44 feeding the sulfuric acid inside the first chemical liquid tank 41 to the first chemical liquid flow passage 42, and a first circulation flow passage 40 returning the sulfuric acid inside the first chemical liquid flow passage 42 to the first chemical liquid tank 41.

The processing liquid supplying system includes a first chemical liquid supply valve 45 that opens and closes the first chemical liquid flow passage 42, a first circulation valve 46 that opens and closes the circulation flow passage 40, and a supply flow passage 47 connected to the first chemical liquid flow passage 42. An upstream switching unit includes the first chemical liquid supply valve 45.

The processing liquid supplying system includes the plurality of upstream flow passages 48 guiding the liquid supplied from the supply flow passage 47 to the plurality of discharge ports 34, a plurality of flowmeters 49 detecting flow rates of the liquids flowing inside the plurality of upstream flow passages 48, a plurality of first flow control valves 50 that change the flow rates of the liquids flowing inside the plurality of upstream flow passages 48, and a plurality of discharge valves 51 respectively opening and closing the plurality of upstream flow passages 48. Although unillustrated, each first flow control valve 50 includes a main valve body that opens and closes the flow passage and an actuator that changes an open degree of the main valve body. The actuator may be a pneumatic actuator or an electric actuator or an actuator besides these.

The processing liquid supplying system includes the plurality of downstream flow passages 52 that guide the liquids supplied from the upstream flow passages 48 to the plurality of discharge ports 34. The downstream end of each of the upstream flow passages 48 besides the first upstream flow passage 48A branches into a plurality of downstream flow passage 52. That is, each of the upstream flow passages 48 besides the first upstream flow passage 48A is a branching upstream flow passage that branches into a plurality of downstream flow passage 52.

FIG. 1 and FIG. 2 show an example where each branching upstream flow passage branches into two downstream flow passages 52. FIG. 5 shows an example where each branching upstream flow passage branches into three downstream flow passages 52. The three downstream flow passages 52 branching from the second upstream flow passage 48B are respectively connected to the three discharge ports 34 (the inner discharge port, middle discharge port, and the outer discharge port) disposed in the same nozzle head 33. The same as the second upstream flow passage 48B applies to the third upstream flow passage 48C and the fourth upstream flow passage 48D. The first upstream flow passage 48A is connected to the first discharge port 34A disposed in the first nozzle 26A.

The processing liquid supplying system includes a plurality of downstream heaters 53 that heat the liquids flowing inside the plurality of upstream flow passages 48 besides the first upstream flow passage 48A at downstream temperatures higher than the upstream temperature. The processing liquid supplying system further includes a plurality of return flow passages 54, respectively connected to the plurality of upstream flow passages 48 besides the first upstream flow passage 48A at positions further downstream than the plurality of downstream heaters 53, and a plurality of return valves 55, respectively opening and closing the plurality of return flow passages 54.

The processing liquid supplying system includes a cooler 56 cooling the chemical liquids supplied from the plurality of return flow passages 54 and a tank recovery flow passage 57 guiding the chemical liquid from the cooler 56 to the chemical liquid tank 41. The chemical liquids supplied from the plurality of return flow passage 54 to the cooler 56 are made closer in temperature to the upstream temperature by the cooler 56 and thereafter guided via the tank recovery flow passage 57 to the chemical liquid tank 41. The cooler 56 may be a water cooled unit or an air cooled unit or may be a cooling unit other than these.

The processing liquid supplying system includes a second chemical liquid tank 61 storing hydrogen peroxide water serving as second chemical liquid, a second chemical liquid flow passage 62 guiding the hydrogen peroxide water fed from the second chemical liquid tank 61, and a second pump 63 feeding the hydrogen peroxide water inside the second chemical liquid tank 61 to the second chemical liquid flow passage 62. The processing liquid supplying system may further include a second upstream heater heating the hydrogen peroxide water flowing through the second chemical liquid flow passage 62 at a temperature higher than room temperature.

The processing liquid supplying system includes a plurality of component liquid flow passages 71 guiding the hydrogen peroxide water supplied from the second chemical liquid flow passage 62 toward the plurality of upstream flow passages 48, a plurality of flowmeters 72 detecting flow rates of liquids flowing inside the plurality of component liquid flow passages 71, a plurality of second flow control valves 73 changing the flow rates of the liquids flowing inside the plurality of component liquid flow passages 71, and a plurality of component liquid valves 74 respectively opening and closing the plurality of component liquid flow passages 71. The same as the structure of the first flow control valve 50 applies to the second flow control valve 73.

Four component liquid flow passages 71, i.e. a first component liquid flow passage 71A, a second component liquid flow passage 71B, a third component liquid flow passage 71C, and a fourth component liquid flow passage 71D are connected to four upstream flow passages 71 at positions further downstream than the discharge valves 51. The first component liquid flow passage 71A through the fourth component liquid flow passage 71D are connected to the first upstream flow passage 48A through the fourth upstream flow passage 48D, respectively. The hydrogen peroxide water inside the component liquid flow passage 71 is supplied to the upstream flow passage 48 and mixed with the sulfuric acid at the upstream flow passage 48. The processing liquid supplying system may further include a plurality of mixer that mix the sulfuric acid and the hydrogen peroxide water at the plurality of upstream flow passages 48.

When the sulfuric acid and the hydrogen peroxide water are mixed with each other, an exothermic reaction occurs. A maximum mixing ratio is defined as a mixing ratio of the sulfuric acid and the hydrogen peroxide water at which the temperature of the mixed liquid (SPM) of the sulfuric acid and the hydrogen peroxide water is the maximum. The maximum mixing ratio is about 2:1 (sulfuric acid:hydrogen peroxide water). The mixing ratio of the sulfuric acid and the hydrogen peroxide water mixed at the upstream flow passage 48 is changed by a mixing ratio changing unit including the plurality of first flow control valves 50 and the plurality of second flow control valves 73. The plurality of first flow control valves 50 and the plurality of second flow control valves 73 are individually controlled by the controller 3. The mixing ratios of the sulfuric acid and the hydrogen peroxide water mixed at the first upstream flow passage 48A to the fourth upstream flow passage 48D are set so that the mixing ratios approach the maximum mixing ratio in the order of the first upstream flow passage 48A to the fourth upstream flow passage 48D. That is, the mixing ratios are set so that the temperatures of the mixed liquids at the plurality of upstream flow passages 48 increase in the order of the first upstream flow passage 48A to the fourth upstream flow passage 48D.

The processing liquid supplying system in a discharging state in which the chemical liquids are discharged from the plurality of discharge ports 34 shall now be described with reference to FIG. 1. In FIG. 1, an open valve is indicated in black and a closed valve is indicated in white.

The sulfuric acid inside the first chemical liquid tank 41 is heated by the first upstream heater 43 and thereafter flows from the first chemical liquid flow passage 42 to the supply flow passage 47 and flows to the plurality of upstream flow passages 48 from the supply flow passage 47. The hydrogen peroxide water inside the second chemical liquid tank 61 flows from the second chemical liquid flow passage 62 to the plurality of component liquid flow passages 71, and flows to the plurality of upstream flow passages 48 from the plurality of component liquid flow passages 71.

The sulfuric acid supplied to the first upstream flow passage 48A is mixed with the hydrogen peroxide water without being heated by the downstream heater 53. The sulfuric acid supplied to the upstream flow passages 48 besides the first upstream flow passage 48A is heated by the downstream heater 53 and thereafter mixed with the hydrogen peroxide water. Thus, the chemical liquid (SPM) is generated at the plurality of upstream flow passages 48.

The chemical liquid inside the first upstream flow passage 48A is supplied to the single first discharge port 34A disposed in the first nozzle 26A. The chemical liquid inside the second upstream flow passage 48B is supplied via the plurality of downstream flow passages 52 to the plurality of second discharge ports 34B disposed in the second nozzle 26B. The same as the second upstream flow passage 48B applies to the third upstream flow passage 48C and the fourth upstream flow passage 48D. The chemical liquids are thereby discharged from all discharge ports 34.

The heating temperatures (downstream temperatures) at which the downstream heaters 53 heat the processing liquids are higher than the heating temperature (upstream temperature) at which the upstream heater 43 heats the processing liquids. The second to fourth downstream temperatures increase in the order of the second to the fourth downstream temperatures. Additionally, the mixing ratios of the sulfuric acid and the hydrogen peroxide mixed at the first upstream flow passage 48A to the fourth upstream flow passage 48D approach the maximum mixing ratio at which the liquid temperature is the maximum in the order of the first upstream flow passage 48A to the fourth upstream flow passage 48D. The temperatures of the chemical liquids discharged from the plurality of discharge ports 34 thus increase in a stepwise manner as the distance from the rotational axis A1 increases.

The processing liquid supplying system in a discharge stoppage state in which the discharges of chemical liquids from the plurality of discharge ports 34 are stopped shall now be described with reference to FIG. 2. In FIG. 2, an open valve is indicated in black and a closed valve is indicated in white.

During discharge stoppage, the supply of the hydrogen peroxide water to the plurality of upstream flow passages 48 is being stopped. The sulfuric acid inside the first chemical liquid tank 41 is fed to the chemical liquid flow passage 42 by the pump 44. A portion of the sulfuric acid fed by the pump 44 is heated by the upstream heater 43 and thereafter returned to the first chemical liquid tank 41 via the circulation flow passage 40. The remaining portion of the sulfuric acid fed by the pump 44 flows from the chemical liquid flow passage 42 to the supply flow passage 47 and flows from the supply flow passage 47 to the plurality of upstream flow passages 48 besides the first upstream flow passage 48A.

The sulfuric acid inside the second upstream flow passage 48 is heated by the downstream heater 53 associated with the second upstream flow passage 48B and thereafter flows via the return flow passage 54 to the cooler 56. The same as the second upstream flow passage 48B applies to the third upstream flow passage 48C and the fourth upstream flow passage 48D. The sulfuric acid supplied to the cooler 56 is cooled by the cooler 56 and returns to the first chemical liquid tank 41 via the tank recovery flow passage 57. All of the sulfuric acid fed to the chemical liquid flow passage 42 by the pump 44 is thereby returned to the first chemical liquid tank 41.

The temperature of the processing liquid may have a large influence on the processing of the substrate W. If the downstream heaters 53 are stopped during discharge stoppage, it will take time for the temperatures of the processing liquids, heated by the downstream heaters 53, to stabilize at the intended temperatures when operation of the downstream heaters 53 is restarted. The discharge of processing liquid thus cannot be restarted immediately and throughput decreases.

As described above, even during discharge stoppage, the sulfuric acid flows to the downstream heaters 53 and the downstream heaters 53 heat the sulfuric acid. It is thus maintained that a state where the temperatures of the downstream heaters 53 are stable. Further, the sulfuric acid heated by the downstream heaters 53 is returned to the first chemical liquid tank 41 and consumption amount of the sulfuric acid can thus be reduced. Moreover, the sulfuric acid that is cooled by the cooler 56 is returned to the first chemical liquid tank 41 and therefore variation of temperature of the sulfuric acid inside the first chemical liquid tank 41 can be suppressed.

Figure 7:
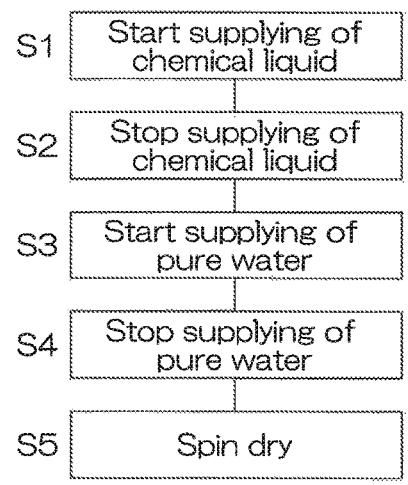
FIG. 7 is a process flowchart for describing an example of substrate processing executed by the substrate processing apparatus.

FIG. 7 is a process flowchart for describing an example of processing of the substrate W executed by the substrate processing apparatus 1. The respective operations described below are executed by the controller 3 controlling the substrate processing apparatus 1. FIG. 3 and FIG. 4 shall be referenced in the following description. FIG. 7 shall be referenced where suitable.

When the substrate W is to be processed by the processing unit 2, the substrate W is carried into the interior of the chamber 7 by a hand (not shown) of the transfer robot in a state where the plurality of nozzles 26 are retracted from above the spin chuck 11 and the splash guard 17 is positioned at the lower position. The substrate W is thereby placed, in a state where the front surface is faced up, on the plurality of chuck pins 13. Thereafter, the hand of the transfer robot is retracted from the interior of the chamber 7 and the carry-in/carry-out port 8a of the chamber 7 is closed by the shutter 9.

After the substrate W has been placed on the plurality of chuck pins 13, the plurality of chuck pins 13 are pressed against peripheral edge portions of the substrate W and the substrate W is gripped by the plurality of chuck pins 13. Also, the guard raising/lowering unit 18 moves the splash guard 17 from the lower position to the upper position. The upper end of the splash guard 17 is thereby disposed higher than the substrate W. Thereafter, the spin motor 14 is driven to start rotation of the substrate W. The substrate W is thereby rotated at a predetermined liquid processing speed (of, for example, several hundred rpm).

Thereafter, the nozzle moving unit 24 moves the plurality of nozzles 26 from the standby position to the processing position. The plurality of discharge ports 34 are thereby overlapped with the substrate W in a plan view. Thereafter, the plurality of discharge valves 51, etc., are controlled and the chemical liquids are discharged at the same time from the plurality of nozzles 26 (step S1 of FIG. 7). The plurality of nozzles 26 discharge the chemical liquids in a state where the nozzle moving unit 24 keeps the plurality of nozzles 26 still. When a predetermined time elapses from the opening of the plurality of discharge valves 51, the discharges of chemical liquids from the plurality of nozzles 26 are stopped at the same time (step S2 of FIG. 7). Thereafter, the nozzle moving unit 24 moves the plurality of nozzles 26 from the processing position to the standby position.

The chemical liquids discharged from the plurality of nozzles 26 land on the upper surface of the rotating substrate W and thereafter flow outward (in the direction away from the rotational axis A1) along the upper surface of the substrate W due to a centrifugal force. The chemical liquid that reaches the upper surface peripheral edge portion of the substrate W is scattered to a periphery of the substrate W and received by an inner peripheral surface of the splash guard 17. The chemical liquid is thereby supplied to the entire upper surface of the substrate W and a liquid film of the chemical liquid that covers the entire upper surface of the substrate W is formed on the substrate W. The entire upper surface of the substrate W is thereby processed by the chemical liquid.

After the discharges of chemical liquids from the plurality of nozzles 26 have been stopped, the rinse liquid valve 23 is opened and discharge of the rinse liquid (pure water) from the rinse liquid nozzle 21 is started (step S3 of FIG. 7). The chemical liquid on the substrate W is thereby rinsed off by the rinse liquid and a liquid film of the rinse liquid that covers the entire upper surface of the substrate W is formed. When a predetermined time elapses from the opening of the rinse liquid valve 23, the rinse liquid valve 23 is closed and the discharge of the rinse liquid from the rinse liquid nozzle 21 is stopped (step S4 of FIG. 7).

After the discharge of the rinse liquid from the rinse liquid nozzle 21 has been stopped, the substrate W is accelerated in the rotational direction by the spin motor 14 and the substrate W is rotated at a drying speed (of, for example, several thousand rpm) higher than the liquid processing speed (step S5 of FIG. 7). The rinse liquid attached to the substrate W is thereby spun off to the periphery of the substrate W and the substrate W is dried. When a predetermined time elapses from the start of high speed rotation of the substrate W, the rotation of the spin motor 14 and the substrate W is stopped.

After the rotation of the substrate W has been stopped, the guard raising/lowering unit 18 moves the splash guard 17 from the upper position to the lower position. Further, the holding of the substrate W by the plurality of chuck pins 13 is released. The transfer robot makes its hand enter the interior of the chamber 7 in the state where the plurality of nozzles 26 are retracted from above the spin chuck 11 and the splash guard 17 is positioned at the lower position. Thereafter, the transfer robot uses the hand to take the substrate W on the spin chuck 11 and carries out the substrate W from the chamber 7.

Figure 8:
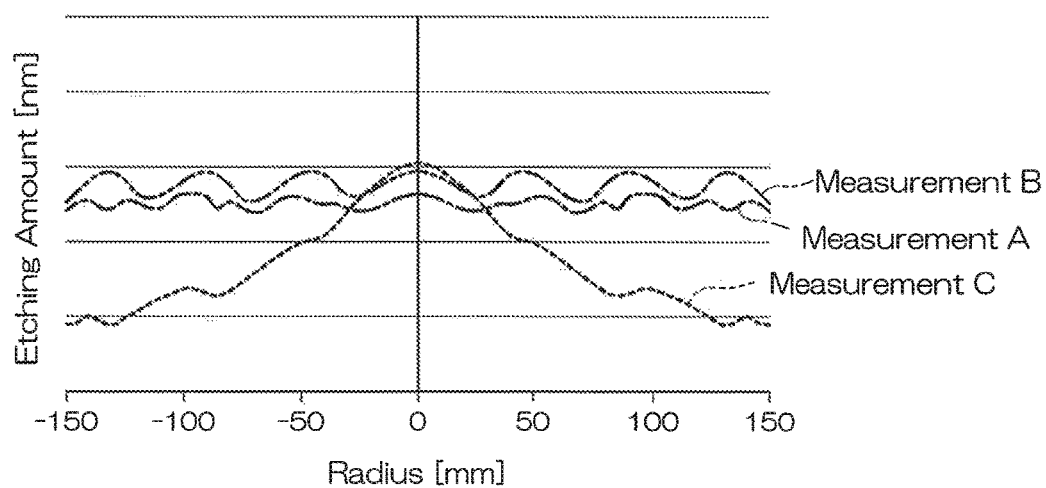
FIG. 8 is a graph of etching amount distributions of substrates.

FIG. 8 is a graph of etching amount distributions of substrates W.

The processing conditions of the substrates W of measurement A to measurement C shown in FIG. 8 are the same with the exception of the nozzles that discharge the chemical liquids.

The measurement A indicates the etching amount distribution when a substrate W is etched by making a plurality of discharge ports 34 (ten discharge ports 34) discharge the chemical liquids while keeping still the plurality of nozzles 26.

The measurement B indicates the etching amount distribution when a substrate W is etched by making a plurality of discharge ports 34 (four discharge ports 34) discharge the chemical liquids while keeping still the plurality of nozzles 26 from which all nozzle heads 33 have been removed. That is, the measurement B indicates the etching amount distribution when the four discharge ports 34 (corresponding to the first discharge port 34A) respectively disposed in the four main nozzle bodies 27 are made to discharge the chemical liquids.

The measurement C indicates the etching amount distribution when just a single discharge port 34 is made to discharge the chemical liquid and the liquid landing position of the chemical liquid is fixed at the upper surface central portion of the substrate W.

With the measurement C, the etching amount decreases with distance away from the central portion of the substrate W and the etching amount distribution exhibits a peak-shaped curve. That is, the etching amount is greatest at the liquid landing position of the chemical liquid and decreases with distance away from the liquid landing position. On the other hand, with the measurement A and the measurement B, the etching amounts at positions besides the central portion of the substrate W are increased and etching uniformity is greatly improved in comparison to the measurement C.

With the measurement B, seven peaks are formed. The apex of the central peak is at a position corresponding to the innermost liquid landing position and the apexes of the two peaks at outer sides thereof are at positions corresponding to the second liquid landing position from the inner side. The positions of the apexes of the two peaks further to the outer sides are positions corresponding to the third liquid landing position from the inner side, and the positions of the two outermost peaks are positions corresponding to the fourth liquid landing position from the inner side.

With the measurement A, a plurality of peaks corresponding to the plurality of liquid landing positions are formed similarly to the measurement B. Whereas with the measurement B, the number of discharge ports 34 is four, with the measurement A, the number of discharge ports 34 is ten and therefore the number of peaks is increased. Further in comparison to the measurement B, the curve indicating the etching amount distribution is closer to a straight line extending in a right/left direction (a straight line of fixed etching amount) and the etching uniformity is improved.

As described above, with the present preferred embodiment, the supply flow passage 47 that guides the processing liquid is branched into the plurality of upstream flow passages 48. The number of discharge ports 34 can thereby be increased. Further, the branching upstream flow passages branching into the plurality of downstream flow passages 52 are included in the plurality of upstream flow passages 48 and the number of discharge ports 34 can thus be increased further.

The processing liquid flowing through the supply flow passage 47 is supplied to the discharge ports 34 from the upstream flow passages 48 or the downstream flow passages 52 and discharged toward the upper surface of the substrate W that rotates around the rotational axis A1. The plurality of discharge ports 34 are respectively disposed at the plurality of positions differing in distance from the rotational axis A1. Temperature uniformity of the processing liquid on the substrate W can thus be increased in comparison to a case where the processing liquid is discharged from just a single discharge port 34. The processing uniformity can thereby be increased while reducing the consumption amount of the processing liquid.

Also with the present preferred embodiment, the hydrogen peroxide water that is one of components of the chemical liquid (SPM) is supplied to the upstream flow passage 48 from the component liquid flow passage 71. The mixing ratio changing unit including the plurality of first flow control valves 50 and the plurality of second flow control valves 73 independently changes mixing ratios of the sulfuric acid and the hydrogen peroxide water included in the chemical liquid to be discharged from the plurality of discharge ports 34 for each of the upstream flow passages 48. Thus, the mixing ratio changing unit can cause the temperatures of the processing liquids supplied to the upper surface of the substrate W to increase in a stepwise manner as the distance from the rotational axis A1 increases. The temperature uniformity can thus be improved in comparison to a case where the chemical liquid of the same temperature is discharged from each discharge port 34, and thereby the processing uniformity can be improved.

In a case where processing liquids are discharged from a plurality of discharge ports 34 toward a plurality of positions that are separated in a radial direction, it is important, in terms of improvement of processing uniformity, that processing liquids of the same quality are supplied to the respective portions of the substrate W. If a tank and a filter, etc., are provided for each discharge port 34, the processing liquid supplied to a certain discharge port 34 may differ in quality from the processing liquid supplied to another discharge port 34. On the other hand, with the present preferred embodiment, the sulfuric acid supplied from the same tank (the first chemical tank 41) and the hydrogen peroxide water supplied from the same tank (the second chemical tank 61) are discharged from the respective discharge ports 34. Processing liquids of the same quality can thereby be discharged from the respective discharge ports 34. Further, in comparison to an arrangement where a tank and a filter, etc., are provided according to each discharge port 34, the number of parts can be reduced and maintenance work can be simplified.

Also with the present preferred embodiment, the upstream ends of the plurality of downstream flow passages 52 are disposed inside the chamber 7. The branching upstream flow passages branch into the plurality of downstream flow passages 52 inside the chamber 7. Each downstream flow passage 52 can thus be reduced in length (length in a direction in which the liquid flows) in comparison to a case where the branching upstream flow passages are branched outside the chamber 7. Temperature decrease of the processing liquid due to heat transfer from the processing liquid to each downstream flow passage 52 can thereby be suppressed.

Also with the present preferred embodiment, the upstream ends of the plurality of upstream flow passages 48 are disposed inside the fluid box 5. The supply flow passage 47 branches into the plurality of upstream flow passages 48 inside the fluid box 5. Each upstream flow passage 48 can thus be reduced in length (length in a direction in which the liquid flows) in comparison to a case where the supply flow passage 47 branches into the plurality of upstream flow passages 48 at a position further upstream than the fluid box 5. Temperature decrease of the processing liquid due to heat transfer from the processing liquid to each upstream flow passage 48 can thereby be suppressed.

Also with the present preferred embodiment, the processing liquids that have been heated at the downstream temperatures higher than the upstream temperature by the downstream heaters 53 are supplied to the discharge ports 34, besides the innermost discharge port (the first discharge port 34A), from the upstream flow passages 48 besides the innermost upstream flow passage (the first upstream flow passage 48A) and are discharged from the discharge ports 34. That is, whereas the processing liquid of the upstream temperature is discharged from the innermost discharge port, the processing liquid of higher temperature than the upstream temperature is discharged from each of the discharge ports 34 positioned further to the outer side than the innermost discharge port.

The temperatures of the processing liquids supplied to the upper surface of the substrate W thus increase stepwise with distance away from the rotational axis A1 and the temperature uniformity can thus be increased in comparison to a case where the processing liquid of the same temperature is discharged from each discharge port 34. The processing uniformity can thereby be increased while reducing the consumption amount of the processing liquid.

Figure 9:
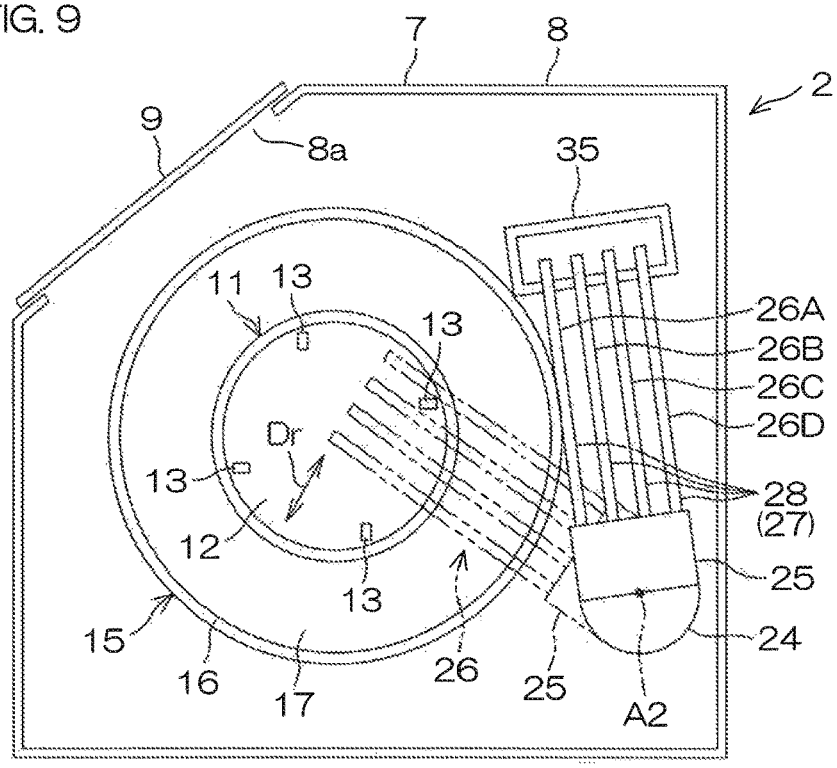
FIG. 9 is a schematic plan view of a plurality of nozzles according to a first modification example of the first preferred embodiment.
Figure 10A:
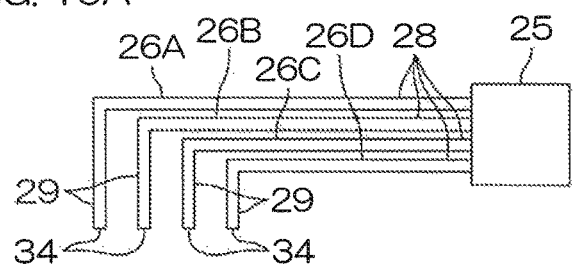
FIG. 10A and FIG. 10B are schematic views of a plurality of nozzles according to a second modification example of the first preferred embodiment, with FIG. 10A being a schematic front view of the plurality of nozzles and FIG. 10B being a schematic plan view of the plurality of nozzles.
Figure 10B:
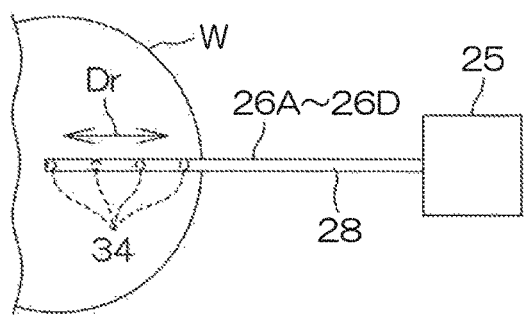

Also with the present preferred embodiment, the first discharge port 34A and the second discharge port 34B are aligned in the radial direction in a plan view Dr. When the plurality of nozzles 26 of the same length are aligned in a horizontal direction orthogonal to the longitudinal direction D1 so that the plurality of discharge ports 34 are aligned in the radial direction in a plan view Dr, an entirety of the plurality of nozzles 26 increases in width (see FIG. 9). When the plurality of nozzles 26 of different lengths are aligned in a vertical direction so that the plurality of discharge ports 34 are aligned in the radial direction in a plan view Dr, the entirety of the plurality of nozzles 26 increases in height (see FIG. 10A and FIG. 10B).

On the other hand, with the present preferred embodiment, the plurality of arm portions 28 are aligned in the horizontal alignment direction D2 orthogonal to the longitudinal direction D1. Further, the tips 28a of the plurality of arm portions 28 are shifted in the longitudinal direction D1 such that, in regard to the longitudinal direction D1, the tips 28a of the plurality of arm portions 28 are aligned in the order of the first nozzle 26A to the fourth nozzle 26D from the rotational axis A1 side (see FIG. 4). The plurality of discharge ports 34 can thereby be aligned in the radial direction Dr in a plan view while suppressing both the width and the height of the entirety of the plurality of nozzles 26.

The present invention is not restricted to the content of the preferred embodiment and various modifications are possible within the scope of the present invention.

For example, although with the preferred embodiment described above, the case where the number of the nozzles 26 is four was described, the number of the nozzles 26 may be two or three or may be five or more.

Although with the preferred embodiment, the case where a downstream heater 53 is not disposed at the first upstream flow passage 48A while downstream heaters 53 are disposed at all upstream flow passages 48 besides the first upstream flow passage 48A was described, the downstream heaters 53 may be disposed at all upstream flow passages 48 including the first upstream flow passage 48A. Oppositely, the downstream heaters 53 do not have to be disposed at all of the upstream flow passages 48. The same applies to the return passages 54.

Although with the preferred embodiment, the case where a nozzle head 33 is not disposed at the first nozzle 26A while nozzle heads 33 are mounted on all nozzles 26 besides the first nozzle 26A was described, the nozzle heads 33 may be disposed at all nozzles 26 including the first nozzle 26A. Oppositely, the nozzle heads 33 do not have to be disposed at all of the nozzles 26.

Although with the preferred embodiment, the case where three downstream flow passages 52 and three discharge ports 34 are defined in a single nozzle head 33 was described, the number of downstream flow passages 52 and discharge ports 34 defined in a single nozzle head 33 may be two or may be four or more.

Although with the preferred embodiment, the case where each of the branching upstream flow passages (the upstream flow passages 48 besides the first upstream flow passage 48A) branches into a plurality of the downstream flow passages 52 within the chamber 7 was described, the branching upstream flow passages may branch outside the chamber 7 instead.

Although with the preferred embodiment, the case where the plurality of discharge ports 34 are aligned in the radial direction Dr in a plan view was described, as long as the plurality of discharge ports 34 are respectively disposed at positions differing in distance from the rotational axis A1, the plurality of discharge ports 34 do not have to be aligned in the radial direction Dr in a plan view.

Although with the preferred embodiment, the case where the plurality of nozzles 26 are made to discharge the chemical liquids while keeping the plurality of nozzles 26 still was described, the plurality of nozzles 26 may be made to discharge the chemical liquids while making the plurality of nozzles 26 pivot around the nozzle pivoting axis A2.

Although with the preferred embodiment, the case where all of the discharge valves 51 are opened at the same time and all of the discharge valves 51 are closed at the same time was described, the controller 3 may control the plurality of discharge valves 51 so that the time during which a discharge port 34 at an outer side is discharging the processing liquid is longer than the time during which a discharge port 34 at an inner side is discharging the processing liquid.

Although with the preferred embodiment, the case where the first chemical liquid flow passage 42 that supplies the chemical liquid to the supply flow passage 47 is provided was described, a plurality of processing liquid flow passages that supply liquids to the supply flow passage 47 may be provided.

For example, a first liquid may be supplied from a first liquid flow passage to the supply flow passage 47 and a second liquid may be supplied from a second liquid flow passage to the supply flow passage 47. In this case, the first liquid and the second liquid are mixed in the supply flow passage 47 and therefore a mixed liquid containing the first liquid and the second liquid and serving as processing liquid is supplied from the supply flow passage 47 to the plurality of upstream flow passages 48. The first liquid and the second liquid may be liquids of the same type or may be liquids of different types. Specific examples of the first liquid and the second liquid include a combination of sulfuric acid and hydrogen peroxide water and a combination of TMAH and pure water.

The controller 3 may control the temperatures of the processing liquids supplied to respective portions of the front surface of the substrate W in accordance with a thickness of a thin film before processing to make uniform the thickness of the thin film after processing.

Figure 11:
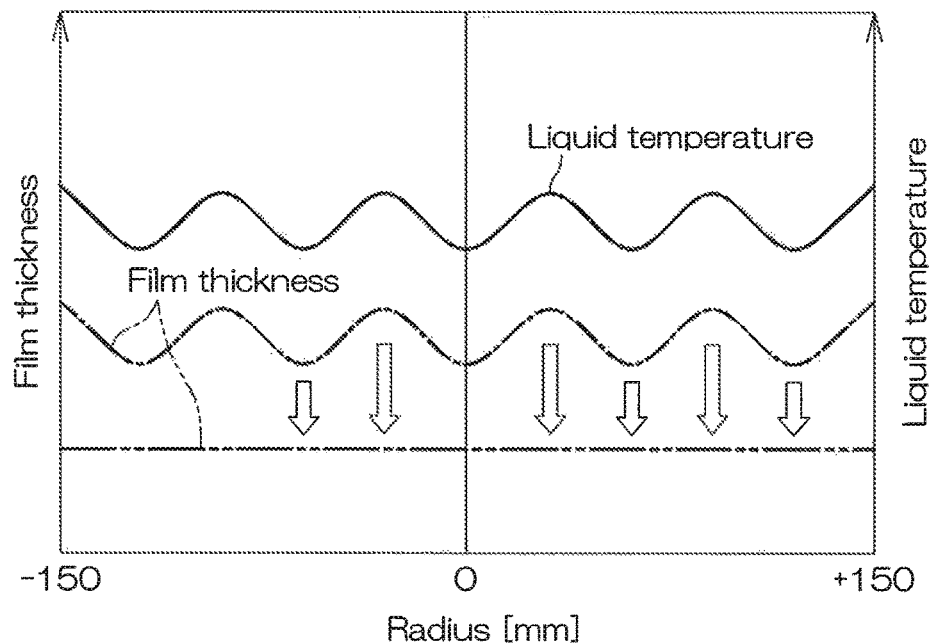
FIG. 11 is a graph showing a conceptual image of a thickness of a thin film before and after processing and a temperature of a processing liquid supplied to a substrate.

FIG. 11 is a graph showing a conceptual image of a thickness of a thin film before and after processing and a temperature of a processing liquid supplied to a substrate W. An alternate long and short dashes line in FIG. 11 indicates the film thickness before processing and an alternate long and two short dashes line in FIG. 11 indicates the film thickness after processing. A solid line in FIG. 11 indicates the temperatures of the processing liquids supplied to the substrate W. The abscissa axis of FIG. 11 indicates the radius of the substrate W. The film thickness before processing may be input into the substrate processing apparatus 1 from an apparatus (for example, a host computer) other than the substrate processing apparatus 1 or may be measured by a measuring instrument provided in the substrate processing apparatus 1.

With the example shown in FIG. 11, the controller 3 may control the substrate processing apparatus 1 so that the temperatures of the processing liquids vary similarly to the film thickness before processing. Specifically, the controller 3 may control the plurality of downstream heaters 53 or a mixing ratio changing unit including the plurality of first flow control valves 50 and the plurality of second flow control valves 73 so that the temperatures of the processing liquids in the plurality of upstream flow passages 48 are temperatures that are in accordance with the film thickness before processing.

In this case, processing liquid of relatively high temperature is supplied to a position at which the film thickness before processing is relatively large and processing liquid of relatively low temperature is supplied to a position at which the film thickness before processing is relatively small. The etching amount of the thin film formed on the front surface of the substrate W increases relatively at a position at which processing liquid of high temperature is supplied and decreases relatively at a position at which processing liquid of low temperature is supplied. The thin film is thus made uniform in thickness after processing.

Two or more of any of the arrangements described above may be combined. Two or more of any of the processes described above may be combined.

Second Preferred Embodiment

A second preferred embodiment of the present invention shall now be described. Components equivalent to the respective portions described above shall be provided with the same reference symbols as in FIG. 1, etc., and description thereof shall be omitted.

The processing liquid supplying system includes the chemical liquid tank 41 storing the chemical liquid, the chemical liquid flow passage 42 guiding the chemical liquid fed from the chemical liquid tank 41, the upstream heater 43 heating the chemical liquid flowing inside the chemical liquid flow passage 42 at the upstream temperature higher than room temperature (for example, of 20 to 30° C.) to adjust the temperature of the chemical liquid inside the chemical liquid tank 41, the pump 44 feeding the chemical liquid inside the chemical liquid tank 41 to the chemical liquid flow passage 42, and the circulation flow passage 40 returning the chemical liquid inside the chemical liquid flow passage 42 to the chemical liquid tank 41.

The processing liquid supplying system includes the supply valve 45 that opens and closes the chemical liquid flow passage 42, the circulation valve 46 that opens and closes the circulation flow passage 40, and the supply flow passage 47 connected to the chemical liquid flow passage 42. An upstream switching unit includes the liquid supply valve 45.

The processing liquid supplying system includes the plurality of upstream flow passages 48 guiding the liquid supplied from the supply flow passage 47 to the plurality of discharge ports 34, a plurality of flowmeters 49 detecting flow rates of the liquids flowing inside the plurality of upstream flow passages 48, a plurality of flow control valves 50 that change the flow rates of the liquids flowing inside the plurality of upstream flow passages 48, and a plurality of discharge valves 51 respectively opening and closing the plurality of upstream flow passages 48. Although unillustrated, each flow control valve 50 includes a main valve body that opens and closes the flow passage and an actuator that changes an open degree of the main valve body. The actuator may be a pneumatic actuator or an electric actuator or an actuator besides these.

The processing liquid supplying system includes the plurality of downstream flow passages 52 that guide the liquids supplied from the upstream flow passages 48 to the plurality of discharge ports 34. The downstream end of each of the upstream flow passages 48 besides the first upstream flow passage 48A branches into a plurality of downstream flow passage 52. That is, each of the upstream flow passages 48 besides the first upstream flow passage 48A is a branching upstream flow passage that branches into a plurality of downstream flow passage 52.

FIG. 1 and FIG. 2 show an example where each branching upstream flow passage branches into two downstream flow passages 52. FIG. 5 shows an example where each branching upstream flow passage branches into three downstream flow passages 52. The three downstream flow passages 52 branching from the second upstream flow passage 48B are respectively connected to the three discharge ports 34 (the inner discharge port, middle discharge port, and the outer discharge port) disposed in the same nozzle head 33. The same as the second upstream flow passage 48B applies to the third upstream flow passage 48C and the fourth upstream flow passage 48D. The first upstream flow passage 48A is connected to the first discharge port 34A disposed in the first nozzle 26A.

The processing liquid supplying system includes a plurality of downstream heaters 53 that heat the liquids flowing inside the plurality of upstream flow passages 48 besides the first upstream flow passage 48A at downstream temperatures higher than the upstream temperature. The processing liquid supplying system further includes a plurality of return flow passages 54, respectively connected to the plurality of upstream flow passages 48 besides the first upstream flow passage 48A at positions further downstream than the plurality of downstream heaters 53, and a plurality of return valves 55, respectively opening and closing the plurality of return flow passages 54. A downstream switching unit 40 includes the plurality of discharge valves 51 and the plurality of return valves 55.

The processing liquid supplying system includes the cooler 56 cooling the chemical liquids supplied from the plurality of return flow passages 54 and the tank recovery flow passage 57 guiding the chemical liquid from the cooler 56 to the chemical liquid tank 41. The chemical liquids supplied from the plurality of return flow passage 54 to the cooler 56 are made closer in temperature to the upstream temperature by the cooler 56 and thereafter guided via the tank recovery flow passage 57 to the chemical liquid tank 41. The cooler 56 may be a water cooled unit or an air cooled unit or may be a cooling unit other than these.

The processing liquid supplying system in a discharging state in which the chemical liquids are discharged from the plurality of discharge ports 34 shall now be described with reference to FIG. 1. In FIG. 1, an open valve is indicated in black and a closed valve is indicated in white.

The chemical liquid inside the chemical liquid tank 41 is fed to the chemical liquid flow passage 42 by the pump 44. The chemical liquid fed by the pump 44 is heated by the upstream heater 43 and thereafter flows from the chemical liquid flow passage 42 to the supply flow passage 47 and flows to the plurality of upstream flow passages 48 from the supply flow passage 47. The chemical liquids supplied to the plurality of branching upstream flow passages, i.e. the plurality of upstream flow passages 48 besides the first upstream flow passage 48A are heated by the downstream heaters 53 and thereafter flow to the plurality of downstream flow passage 52.

The chemical liquid inside the first upstream flow passage 48A is supplied to the single first discharge port 34A disposed in the first nozzle 26A. The chemical liquid inside the second upstream flow passage 48B is supplied via the plurality of downstream flow passages 52 to the plurality of second discharge ports 34B disposed in the second nozzle 26B. The same as the second upstream flow passage 48B applies to the third upstream flow passage 48C and the fourth upstream flow passage 48D. The chemical liquids are thereby discharged from all discharge ports 34.

The heating temperatures (downstream temperatures) of the processing liquids by the downstream heaters 53 are higher than the heating temperature (upstream temperature) of the processing liquid by the upstream heater 43. The second to fourth downstream temperatures increase in the order of the second to the fourth downstream temperatures. The first discharge port 34A discharges the chemical liquid of the upstream temperature. Each of the second discharge ports 34B discharges the chemical liquid of the second downstream temperature. Each of the third discharge ports 34C discharges the chemical liquid of the third downstream temperature. Each of the fourth discharge ports 34D discharges the chemical liquid of the fourth downstream temperature. The temperatures of the chemical liquids discharged from the plurality of discharge ports 34 thus increase stepwise with distance away from the rotational axis A1.

The processing liquid supplying system in a discharge stoppage state in which the discharges of chemical liquids from the plurality of discharge ports 34 are stopped shall now be described with reference to FIG. 2. In FIG. 2, an open valve is indicated in black and a closed valve is indicated in white.

The chemical liquid inside the chemical liquid tank 41 is fed to the chemical liquid flow passage 42 by the pump 44. A portion of the chemical liquid fed by the pump 44 is heated by the upstream heater 43 and thereafter returned to the chemical liquid tank 41 via the circulation flow passage 40. The remaining portion of the chemical liquid fed by the pump 44 flows from the chemical liquid flow passage 42 to the supply flow passage 47 and flows from the supply flow passage 47 to the plurality of upstream flow passages 48 besides the first upstream flow passage 48A.

The chemical liquid inside the second upstream flow passage 48 is heated by the downstream heater 53 associated with the second upstream flow passage 48B and thereafter flows via the return flow passage 54 to the cooler 56. The same as the second upstream flow passage 48B applies to the third upstream flow passage 48C and the fourth upstream flow passage 48D. The chemical liquids supplied to the cooler 56 are cooled by the cooler 56 and return to the chemical liquid tank 41 via the tank recovery flow passage 57. All of the chemical liquid fed to the chemical liquid flow passage 42 by the pump 44 is thereby returned to the chemical liquid tank 41.

The temperature of the processing liquid may have a large influence on the processing of the substrate W. If the downstream heaters 53 are stopped during discharge stoppage, it will take time for the temperatures of the processing liquids, heated by the downstream heaters 53, to stabilize at the intended temperatures when operation of the downstream heaters 53 is restarted. The discharge of processing liquid thus cannot be restarted immediately and throughput decreases.

As described above, even during discharge stoppage, the chemical liquids are made to continue to flow to the downstream heaters 53 and the downstream heaters 53 are made to heat the chemical liquids. A state where the temperatures of the downstream heaters 53 are stable can thus be maintained. Further, the chemical liquids heated by the downstream heaters 53 are returned to the chemical liquid tank 41 and the consumption amount of the chemical liquid can thus be reduced. Moreover, the chemical liquid that is cooled by the cooler 56 is returned to the chemical liquid tank 41 and therefore variation of temperature of the chemical liquid inside the chemical liquid tank 41 can be suppressed.

An example of processing of the substrate W executed by the substrate processing apparatus 1 according to the second preferred embodiment is the same as the example of processing of the substrate W executed by the substrate processing apparatus 1 according to the first preferred embodiment. Etching amount distributions of the substrates W according to the second preferred embodiment is the same as the etching amount distributions of the substrates W according to the first preferred embodiment.

With the second preferred embodiment, the following operations and effects are obtained in addition to the operations and effects according to the first preferred embodiment.

With the present preferred embodiment, the processing liquids that have been heated at the downstream temperatures higher than the upstream temperature by the downstream heaters 53 are supplied to the discharge ports 34, besides the innermost discharge port (the first discharge port 34A), from the upstream flow passages 48 besides the innermost upstream flow passage (the first upstream flow passage 48A) and are discharged from the discharge ports 34. That is, whereas the processing liquid of the upstream temperature is discharged from the innermost discharge port, the processing liquid of higher temperature than the upstream temperature is discharged from each of the discharge ports 34 positioned further to the outer side than the innermost discharge port.

The temperatures of the processing liquids supplied to the upper surface of the substrate W thus increase stepwise with distance away from the rotational axis A1 and the temperature uniformity can thus be increased in comparison to a case where the processing liquid of the same temperature is discharged from each discharge port 34. The processing uniformity can thereby be increased while reducing the consumption amount of the processing liquid.

The present invention is not restricted to the content of the preferred embodiment and various modifications are possible within the scope of the present invention.

For example, although with the preferred embodiment described above, the case where the number of the nozzles 26 is four was described, the number of the nozzles 26 may be two or three or may be five or more.

Although with the preferred embodiment, the case where the chemical liquid flowing through each of the return flow passages 54 toward the chemical tank 41 is cooled by the cooler 56 was described, the cooler 56 may be omitted.

Although with the preferred embodiment, the case where, during discharge stoppage, the liquids heated by the downstream heaters 53 are made to flow from the upstream flow passages 48 to the return flow passages 54 was described, if the downstream heaters 53 are to be stopped during discharge stoppage, the return flow passages 54 may be omitted.

Although with the preferred embodiment, the case where a downstream heater 53 is not disposed at the first upstream flow passage 48A while downstream heaters 53 are disposed at all upstream flow passages 48 besides the first upstream flow passage 48A was described, the downstream heaters 53 may be disposed at all upstream flow passages 48 including the first upstream flow passage 48A. To the contrary, the downstream heaters 53 may be omitted from all upstream flow passages 48. The same applies to the return flow passages 54.

Although with the preferred embodiment, the case where a nozzle head 33 is not disposed at the first nozzle 26A while nozzle heads 33 are mounted on all nozzles 26 besides the first nozzle 26A was described, the nozzle heads 33 may be disposed at all nozzles 26 including the first nozzle 26A. Oppositely, the nozzle heads 33 do not have to be disposed at all of the nozzles 26.

Although with the preferred embodiment, the case where three downstream flow passages 52 and three discharge ports 34 are defined in a single nozzle head 33 was described, the number of downstream flow passages 52 and discharge ports 34 defined in a single nozzle head 33 may be two or may be four or more.

Although with the preferred embodiment, the case where each of the branching upstream flow passages (the upstream flow passages 48 besides the first upstream flow passage 48A) branches into a plurality of the downstream flow passages 52 within the chamber 7 was described, the branching upstream flow passages may branch outside the chamber 7 instead.

Although with the preferred embodiment, the case where the plurality of discharge ports 34 are aligned in the radial direction Dr in a plan view was described, as long as the plurality of discharge ports 34 are respectively disposed at positions differing in distance from the rotational axis A1, the plurality of discharge ports 34 do not have to be aligned in the radial direction Dr in a plan view.

Although with the preferred embodiment, the case where the plurality of nozzles 26 are made to discharge the chemical liquids while keeping the plurality of nozzles 26 still was described, the plurality of nozzles 26 may be made to discharge the chemical liquids while making the plurality of nozzles 26 pivot around the nozzle pivoting axis A2.

Although with the preferred embodiment, the case where all of the discharge valves 51 are opened at the same time and all of the discharge valves 51 are closed at the same time was described, the controller 3 may control the plurality of discharge valves 51 so that the time during which a discharge port 34 at an outer side is discharging the processing liquid is longer than the time during which a discharge port 34 at an inner side is discharging the processing liquid.

Although with the preferred embodiment, the case where the chemical liquid flow passage 42 that supplies the chemical liquid to the supply flow passage 47 is provided was described, a plurality of processing liquid flow passages that supply liquids to the supply flow passage 47 may be provided.

For example, a first liquid may be supplied from a first liquid flow passage to the supply flow passage 47 and a second liquid may be supplied from a second liquid flow passage to the supply flow passage 47. In this case, the first liquid and the second liquid are mixed in the supply flow passage 47 and therefore a mixed liquid containing the first liquid and the second liquid is supplied from the supply flow passage 47 to the plurality of upstream flow passages 48. The first liquid and the second liquid may be liquids of the same type or may be liquids of different types. Specific examples of the first liquid and the second liquid include a combination of sulfuric acid and hydrogen peroxide water and a combination of TMAH and pure water.

The controller 3 may control the temperatures of the processing liquids supplied to respective portions of the front surface of the substrate W in accordance with a thickness of a thin film before processing to make uniform the thickness of the thin film after processing.

FIG. 11 is a graph showing a conceptual image of the thickness of a thin film before and after processing and the temperature of a processing liquid supplied to a substrate W. The alternate long and short dashes line in FIG. 11 indicates the film thickness before processing and the alternate long and two short dashes line in FIG. 11 indicates the film thickness after processing. The solid line in FIG. 11 indicates the temperatures of the processing liquids supplied to the substrate W. The abscissa axis of FIG. 11 indicates the radius of the substrate W. The film thickness before processing may be input into the substrate processing apparatus 1 from an apparatus (for example, a host computer) other than the substrate processing apparatus 1 or may be measured by a measuring instrument provided in the substrate processing apparatus 1.

With the example shown in FIG. 11, the controller 3 may control the substrate processing apparatus 1 so that the temperatures of the processing liquids vary similarly to the film thickness before processing. Specifically, the controller 3 may control the plurality of downstream heaters 53 so that the temperatures of the processing liquids in the plurality of upstream flow passages 48 are temperatures that are in accordance with the film thickness before processing.

In this case, processing liquid of relatively high temperature is supplied to a position at which the film thickness before processing is relatively large and processing liquid of relatively low temperature is supplied to a position at which the film thickness before processing is relatively small. The etching amount of the thin film formed on the front surface of the substrate W increases relatively at a position at which processing liquid of high temperature is supplied and decreases relatively at a position at which processing liquid of low temperature is supplied. The thin film is thus made uniform in thickness after processing.

Figure 12:
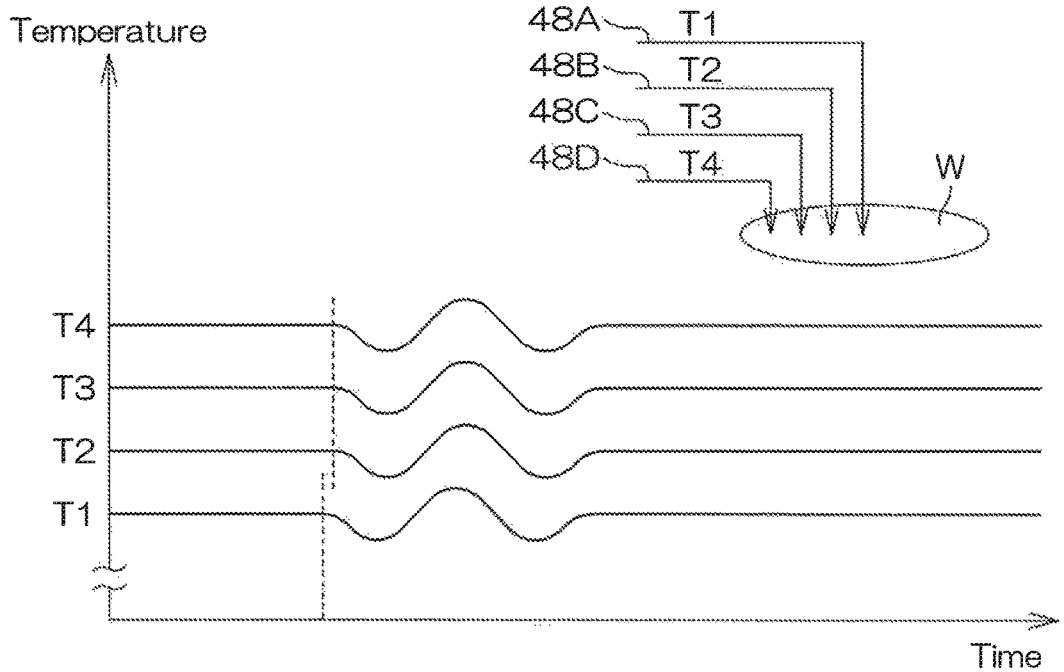
FIG. 12 is a view showing an example of temporal changes of temperatures of chemical liquids at a plurality of upstream flow passages according to a second preferred embodiment of the present invention.

FIG. 12 is a view showing an example of temporal changes of temperatures of the chemical liquids at the plurality of upstream flow passages 48. The temperatures of the chemical liquids at the plurality of upstream flow passages 48 are defined as a temperature T1 to a temperature T4. The temperatures T1 to T4 increase in this order. That is, the controller 3 controls the plurality of downstream heaters 53 so that the temperatures T1 to T4 increase in this order. Each of a temperature difference $\Delta 21$ (=the temperature T2−the temperature T1), a temperature difference $\Delta 32$ (=the temperature T3−the temperature T2), and a temperature difference $\Delta 43$ (=the temperature T4−the temperature T3) is a positive value. These temperature differences may be equal to each other and may be different from each other.

The heating temperature of the upstream heater 43 is not necessarily constant and may change around a preset temperature. When the heating temperature of the upstream heater 43 changes, as shown in FIG. 12, the temperature T1 will also change. However, since the downstream heater 53 is provided at each of the second upstream flow passage 48B to the fourth upstream flow passage 48D, if the fluctuation of the temperature T1 occurs, the temperature T2 to the temperature T4 do not change or hardly change. In this case, since the temperature differences between the chemical liquid to be discharged from the first discharge port 34A and the chemical liquids to be discharged from the other discharge ports 34 will increase or decrease with respect to the intended value, the processing uniformity may be degraded.

In such a case, the controller 3 may control the plurality of downstream heaters 53 so that the temperature T2 to the temperature T4 follow the temperature T1 in accordance with the change of the temperature T1. Specifically, the controller 3 may detect the temperature T1 to the temperature T4 based on detected values of a plurality of temperature sensors provided at the first upstream flow passage 48A to the fourth upstream flow passage 48D, respectively. The controller 3 also may uniformly change the temperature T2 to the temperature T4 by the same amount as the temperature T1 when the temperature T1 changes, as shown in FIG. 12. In this case, the processing uniformity can be stabilized.

Two or more of any of the arrangements described above may be combined. Two or more of any of the processes described above may be combined.

Third Preferred Embodiment

A third preferred embodiment of the present invention shall now be described. Components equivalent to the respective portions described above shall be provided with the same reference symbols as in FIG. 1, etc., and description thereof shall be omitted.

The plurality of nozzles 26 shall now be described with reference to FIG. 5 and FIG. 6. Thereafter, the processing liquid supplying system shall be described.

In the following description, "first" and "A" may be added to the beginning and the end of an arrangement corresponding to the first nozzle 26A. For example, an upstream flow passage 48 associated with the first nozzle 26A may be referred to as the "first upstream flow passage 48A." The same applies to arrangements associated with the second nozzle 26B to the fourth nozzle 26D.

As shown in FIG. 5, each main nozzle body 27 includes a resin tube 30 that guides the processing liquid, a core bar 31 including cylindrical cross section that surrounds the resin tube 30, and a resin coating 32 including cylindrical cross section that surrounds an outer surface of the core bar 31. Each of the nozzles 26 besides the first nozzle 26A further includes a nozzle head 33 mounted on the tip portion 29 of the main nozzle body 27.

Each main nozzle body 27 defines a single flow passage extending along the main nozzle body 27. Each nozzle head 33 defines a plurality of flow passages guiding the processing liquid supplied from the main nozzle body 27. The flow passage of the main nozzle body 27 defines a discharge port 34 opening at an outer surface of the main nozzle body 27. The plurality of flow passages of the nozzle head 33 define a plurality of discharge ports 34 opening at an outer surface of the nozzle head 33. The flow passage of the main nozzle body 27 corresponds to a portion of an upstream flow passage 48 to be described below. Each of the flow passages of the nozzle head 33 corresponds to a downstream flow passage 52 to be described below. Downstream ends of the first upstream flow passage 48A to the fourth upstream flow passage 48D are respectively disposed at a plurality of positions differing in distance from the rotational axis A1.

FIG. 5 and FIG. 6 show an example where the total number of discharge ports 34 disposed in the plurality of nozzles 26 is ten. The first nozzle 26A includes a single discharge port 34 disposed in the main nozzle body 27. Each of the nozzles 26 besides the first nozzle 26A includes three discharge ports 34 disposed in the nozzle head 33. The three discharge ports 34 disposed in the same nozzle head 33 are constituted of an inner branched discharge port that is closest to the rotational axis A1 among the three discharge ports 34, an outer branched discharge port that is furthest from the rotational axis A1 among the three discharge ports 34, and a middle branched discharge port disposed between the inner branched discharge port and the outer branched discharge port.

As shown in FIG. 6, the plurality of discharge ports 34 are aligned rectilinearly in a plan view. An interval between the two discharge ports 34 at the respective ends is not more than a radius of the substrate W. An interval between two discharge ports 34 that are adjacent may be the same as any of the other intervals or may differ from at least one of the other intervals. Also, the plurality of discharge ports 34 may be disposed at the same height or may be disposed at two or more different heights.

When the plurality of nozzles 26 are disposed at the processing position, the plurality of discharge ports 34 are respectively disposed at a plurality of positions that differ in distance (shortest distance in a plan view) from the rotational axis A1. In this state, an innermost discharge port (first discharge port 34A) that is closest to the rotational axis A1 among the plurality of discharge ports 34 is disposed above a central portion of the substrate W, and an outermost discharge port (fourth discharge port 34D) that is furthest from the rotational axis A1 among the plurality of discharge ports 34 is disposed above a peripheral edge portion of the substrate W, The plurality of discharge ports 34 are aligned in the radial direction Dr in a plan view.

The first discharge port 34A disposed in the first nozzle 26A is a main discharge port that discharges the processing liquid toward an upper surface central portion of the substrate W. The second discharge port 34B to the fourth discharge port 34D that are disposed in the respective nozzles 26 besides the first nozzle 26A are a plurality of auxiliary discharge ports that discharge the processing liquids toward a portion of the upper surface of the substrate W besides the central portion. The first upstream flow passage 48A connected to the first discharge port 34A is a main upstream flow passage and the second upstream flow passage 48B to the fourth upstream flow passage 48D that are connected to the second discharge port 34B to the fourth discharge port 34D are a plurality of auxiliary upstream flow passages.

The fourth discharge port 34D provided in the fourth nozzle 26D is an outer discharge port that discharges the processing liquid toward the upper surface peripheral edge portion of the substrate W. The first discharge port 34A to the third discharge port 34C provided in the respective nozzles 26 besides the fourth nozzle 26D are a plurality of inner discharge ports that discharge the processing liquid toward a portion of the upper surface of the substrate W other than the peripheral edge portion. The fourth upstream flow passage 48D connected to the fourth nozzle 26D is an outer upstream flow passage, and the first upstream flow passage 48A to the third upstream flow passage 48C connected to the first discharge port 34A to the third discharge port 34C is a plurality of inner upstream flow passages.

As shown in FIG. 5, each discharge port 34 discharges the chemical liquid in a discharge direction perpendicular to the upper surface of the substrate W. The plurality of discharge ports 34 discharge the chemical liquids toward a plurality of liquid landing positions within the upper surface of the substrate W. The plurality of liquid landing positions are separate positions that differ in distance from the rotational axis A1. If the liquid landing position that is closest to the rotational axis A1 among the plurality of liquid landing positions is referred to as the "first liquid landing position" and the liquid landing position that is second closest to the rotational axis A1 among the plurality of liquid landing positions is referred to as the "second liquid landing position," the chemical liquid discharged from the first discharge port 34A lands on the first liquid landing position and the chemical liquid discharged from the second discharge port 34B lands on the second liquid landing position.

The processing liquid supplying system shall now be described in detail with reference to FIG. 13 and FIG. 14.

A high-temperature chemical liquid and a low-temperature chemical liquid described below are chemical liquids that are of the same type and different from each other in temperature. A specific example of the chemical liquid is TMAH. The high-temperature chemical liquid is a chemical liquid higher in temperature than the room temperature, and the low-temperature chemical liquid is a chemical liquid lower in temperature than the high-temperature chemical liquid. The temperature of the low-temperature chemical liquid may be equal to the room temperature and may be higher or lower than the room temperature as long as it is lower than that of the high-temperature chemical liquid.

The processing liquid supplying system includes a first chemical liquid tank 41 storing high-temperature chemical liquid higher in temperature than the room temperature. The processing liquid supplying system further includes a first chemical liquid flow passage 42 guiding the chemical liquid fed from first chemical liquid tank 41, a first upstream heater 43 heating the chemical liquid flowing inside the first chemical liquid flow passage 42 at the upstream temperature higher than room temperature (for example, of 20 to 30° C.) to adjust the temperature of the chemical liquid inside the first chemical liquid tank 41, a first pump 44 feeding the chemical liquid inside the first chemical liquid tank 41 to the first chemical liquid flow passage 42, and a first circulation flow passage 40 returning the chemical liquid inside the first chemical liquid flow passage 42 to the first chemical liquid tank 41.

The processing liquid supplying system includes a first chemical liquid supply valve 45 that opens and closes the first chemical liquid flow passage 42, a first circulation valve 46 that opens and closes the first circulation flow passage 40, and a supply flow passage 47 connected to the first chemical liquid flow passage 42. An upstream switching unit includes the first chemical liquid supply valve 45.

The processing liquid supplying system includes the plurality of upstream flow passages 48 guiding the liquid supplied from the supply flow passage 47 to the plurality of discharge ports 34, a plurality of flowmeters 49 detecting flow rates of the liquids flowing inside the plurality of upstream flow passages 48, a plurality of first flow control valves 50 that change the flow rates of the liquids flowing inside the plurality of upstream flow passages 48, and a plurality of discharge valves 51 respectively opening and closing the plurality of upstream flow passages 48. Although unillustrated, each first flow control valve 50 includes a main valve body that opens and closes the flow passage and an actuator that changes an open degree of the main valve body. The actuator may be a pneumatic actuator or an electric actuator or an actuator besides these.

The processing liquid supplying system includes the plurality of downstream flow passages 52 that guide the liquids supplied from the upstream flow passages 48 to the plurality of discharge ports 34. The downstream end of each of the upstream flow passages 48 besides the first upstream flow passage 48A branches into a plurality of downstream flow passages 52. That is, each of the upstream flow passages 48 besides the first upstream flow passage 48A is a branching upstream flow passage that branches into a plurality of downstream flow passage 52.

FIG. 13 and FIG. 14 show an example where each branching upstream flow passage branches into two downstream flow passages 52. FIG. 5 shows an example where each branching upstream flow passage branches into three downstream flow passages 52. The three downstream flow passages 52 branching from the second upstream flow passage 48B are respectively connected to the three discharge ports 34 disposed in the same nozzle head 33. The same as the second upstream flow passage 48B applies to the third upstream flow passage 48C and the fourth upstream flow passage 48D. The first upstream flow passage 48A is connected to the first discharge port 34A disposed in the first nozzle 26A.

The processing liquid supplying system includes a second chemical liquid tank 61 storing low-temperature chemical liquid lower in temperature than high-temperature chemical liquid, a second chemical liquid flow passage 62 guiding the low-temperature chemical liquid fed from the second chemical liquid tank 61, a second pump 63 feeding the low-temperature chemical liquid inside the second chemical liquid tank 61 to the second chemical liquid flow passage 62, and a second chemical liquid supply valve 64 that opens and closes the second chemical liquid flow passage 62. The processing liquid supplying system further includes a second return flow passage 75 returning the low-temperature chemical liquid inside the second chemical liquid flow passage 62 to the second chemical liquid tank 61, and a second return valves 76 opening and closing the second return flow passage 75. The upstream end of the second return flow passage 75 is connected to the second chemical liquid flow passage 62 at a position further upstream than the second chemical liquid supply valve 64, and the downstream end of the second return flow passage 75 is connected to the second chemical liquid tank 61.

As shown by an alternate long and two short dashes line in FIG. 13 and FIG. 14, the processing liquid supplying system may further include a temperature adjusting device that controls the temperature of the low-temperature chemical liquid flowing through the second chemical liquid flow passage 62. In this case, the temperature adjusting device may be a heater that heats the low-temperature chemical liquid at a temperature higher than the room temperature, and may be a cooler that cools the low-temperature chemical liquid at a temperature lower than the room temperature.

The processing liquid supplying system includes a plurality of low-temperature liquid flow passages 71 (a first low-temperature liquid flow passage 71A, a second low-temperature liquid flow passage 71B, and a third low-temperature liquid flow passage 71C) branching at the downstream ends of the second chemical liquid flow passage 62, a plurality of flowmeters 72 detecting flow rates of liquids flowing inside the plurality of low-temperature liquid flow passages 71, a plurality of second flow control valves 73 changing the flow rates of the liquids flowing inside the plurality of low-temperature liquid flow passages 71, and a plurality of low-temperature liquid valves 74 respectively opening and closing the plurality of low-temperature liquid flow passages 71. The same as the structure of the first flow control valve 50 applies to the second flow control valve 73.

The first low-temperature liquid flow passage 71A to the third low-temperature liquid flow passage 71C are connected to the first upstream flow passage 48A to the third upstream flow passage 48C at positions further downstream than the discharge valves 51, respectively. The low-temperature chemical liquid inside the low-temperature liquid flow passage 71 is supplied to the upstream flow passage 48 and mixed with the high-temperature chemical liquid supplied from the first chemical liquid tank 41 at the upstream flow passage 48. Since the low-temperature chemical liquid is lower in temperature than the high-temperature chemical liquid, mixing the high-temperature chemical liquid and the low-temperature chemical liquid causes lowering of the temperatures of the chemical liquids supplied to the downstream ends of the first upstream flow passage 48A to the third upstream flow passage 48C.

The processing liquid supplying system includes a plurality of temperature sensors 77 that detect temperatures of liquids flowing through the first upstream flow passage 48A to the third upstream flow passage 48C. The plurality of temperature sensors 77 are connected to the first upstream flow passage 48A to the third upstream flow passage 48C at positions further downstream than the low-temperature liquid flow passages 71, respectively. The temperature of the chemical liquid, i.e. the mixed liquid of the high-temperature chemical liquid and the low-temperature chemical liquid is detected by the temperature sensors 77. The controller 3 individually changes the opening degrees of the first flow control valves 50 and the second flow control valves 73 based on detected values of the plurality of temperature sensors 77.

The controller 3 causes the temperatures of the chemical liquids to be supplied to the downstream ends of the first upstream flow passage 48A to the third upstream flow passage 48C to approximate the preset temperatures by controlling the mixing ratio changing unit including the plurality of first flow control valves 50 and the plurality of second flow control valves 73 based on the plurality of temperature sensors 77. Specifically, the controller 3 adjusts the mixing ratios of the high-temperature chemical liquid and the low-temperature chemical liquid so that the temperatures of the chemical liquids to be supplied to the downstream ends of the first upstream flow passage 48A through the third upstream flow passage 48C increase in the order of the first upstream flow passage 48A through the third upstream flow passage 48C.

The processing liquid supplying system in a discharging state in which the chemical liquids are discharged from the plurality of discharge ports 34 shall now be described with reference to FIG. 13. In FIG. 13, an open valve is indicated in black and a closed valve is indicated in white.

In the discharging state, the high-temperature chemical liquid inside the first chemical liquid tank 41 flows from the first chemical liquid flow passage 42 to the supply flow passage 47 and flows to the plurality of upstream flow passages 48 from the supply flow passage 47. The high-temperature chemical liquids supplied to the second upstream flow passages 48B through the fourth upstream flow passages 48D flow to the plurality of downstream flow passage 52.

On the other side, the low-temperature chemical liquid inside the second chemical liquid tank 61 flows from the second chemical liquid flow passage 62 to the plurality of low-temperature liquid flow passages 71, and flows from the plurality of low-temperature liquid flow passages 71 to the first upstream flow passages 48A through the third upstream flow passages 48C. Thus, the high-temperature chemical liquid and the low-temperature chemical liquid are mixed with each other in the first upstream flow passages 48A through the third upstream flow passages 48C.

The chemical liquid inside the first upstream flow passage 48A is supplied to the single first discharge port 34A disposed in the first nozzle 26A. The chemical liquid inside the second upstream flow passage 48B is supplied via the plurality of downstream flow passages 52 to the plurality of second discharge ports 34B (refer to FIG. 5) disposed in the second nozzle 26B. The same as the second upstream flow passage 48B applies to the third upstream flow passage 48C and the fourth upstream flow passage 48D. The chemical liquids are thereby discharged from all discharge ports 34.

The controller 3 adjusts the mixing ratios of the high-temperature chemical liquid and the low-temperature chemical liquid so that the temperatures of the chemical liquids to be supplied to the downstream ends of the first upstream flow passage 48A through the third upstream flow passage 48C increase in the order of the first upstream flow passage 48A through the third upstream flow passage 48C. On the other hand, the downstream end of the fourth upstream flow passage 48D is supplied with the high-temperature chemical liquid that is not mixed with the low-temperature chemical liquid. The temperatures of the chemical liquids discharged from the plurality of discharge ports 34 thus increase stepwise with distance away from the rotational axis A1.

The processing liquid supplying system in a discharge stoppage state in which the discharges of chemical liquids from the plurality of discharge ports 34 are stopped shall now be described with reference to FIG. 14. In FIG. 14, an open valve is indicated in black and a closed valve is indicated in white.

In the discharge stoppage state, the high-temperature chemical liquid inside the first chemical liquid tank 41 is fed to the first chemical liquid flow passage 42 by the first pump 44. The high-temperature chemical liquid fed by the first pump 44 is heated by the first upstream heater 43 and thereafter returns to the first chemical liquid tank 41 via the first circulation flow passage 40. In this state, the first chemical liquid supply valve 45 is closed and thus the high-temperature chemical liquid inside the first chemical liquid tank 41 is not supplied to the plurality of upstream flow passages 48.

On the other hand, the low-temperature chemical liquid inside the second chemical liquid tank 61 is fed to the second chemical liquid flow passage 62 by the second pump 63. The low-temperature chemical liquid fed by the second pump 63 returns to the second chemical liquid tank 61 via the second circulation flow passage 75. In this state, the second chemical liquid supply valve 64 is closed and thus the low-temperature chemical liquid inside the second chemical liquid flow passage 62 is not supplied to the plurality of low-temperature liquid flow passages 71 similarly to the high-temperature chemical liquid.

An example of processing of the substrate W executed by the substrate processing apparatus 1 according to the third preferred embodiment is the same as the example of processing of the substrate W executed by the substrate processing apparatus 1 according to the first preferred embodiment. Etching amount distributions of the substrates W according to the third preferred embodiment is the same as the etching amount distributions of the substrates W according to the first preferred embodiment.

With the third preferred embodiment, the following operations and effects are obtained in addition to the operations and effects according to the first preferred embodiment.

As described above, with the present preferred embodiment, the supply flow passage 47 that guides the processing liquid is branched into the plurality of upstream flow passages 48. The number of discharge ports 34 can thereby be increased. Further, the branching upstream flow passages branching into the plurality of downstream flow passages 52 are included in the plurality of upstream flow passages 48 and the number of discharge ports 34 can thus be increased further.

The processing liquid flowing through the supply flow passage 47 is supplied to the discharge ports 34 from the upstream flow passages 48 or the downstream flow passages 52 and discharged toward the upper surface of the substrate W that rotates around the rotational axis A1. The plurality of discharge ports 34 are respectively disposed at the plurality of positions differing in distance from the rotational axis A1. Temperature uniformity of the processing liquid on the substrate W can thus be increased in comparison to a case where the processing liquid is discharged from just a single discharge port 34. The processing uniformity can thereby be increased while reducing the consumption amount of the processing liquid.

In a case where processing liquids are discharged from a plurality of discharge ports 34 toward a plurality of positions that are separated in a radial direction, it is important, in terms of improvement of processing uniformity, that processing liquids of the same quality are supplied to the respective portions of the substrate W. If a tank and a filter, etc., are provided for each discharge port 34, the processing liquid supplied to a certain discharge port 34 may differ in quality from the processing liquid supplied to another discharge port 34. On the other hand, with the present preferred embodiment, the high-temperature chemical liquids supplied from the same tank (the first chemical tank 41) are discharged from the respective discharge ports 34. Processing liquids of the same quality can thereby be discharged from the respective discharge ports 34. Further, in comparison to an arrangement where a tank and a filter, etc., are provided according to each discharge port 34, the number of parts can be reduced and maintenance work can be simplified.

If the processing liquid is higher in temperature than the substrate W, the heat of the processing liquid is transferred from the processing liquid to the substrate W. Also, since the processing liquid rotates together with the substrate W, the processing liquid on the substrate W flows outward along the upper surface of the substrate W while being cooled by air. Circumferential speeds of respective portions of the substrate W increase as the distance from the rotational axis A1 increases. The processing liquid on the substrate W is cooled more readily when the circumferential speed is higher. Also, if it is supposed that the upper surface of the substrate W can be divided into a plurality of circular annular regions at equal intervals in a radial direction, the respective regions increase in area as the distance from the rotational axis A1 increases. When the surface area increases, heat to be transferred from the processing liquid to a circular annular region increases. Therefore if the temperatures of the processing liquids discharged from the discharge ports 34 are all the same, sufficient temperature uniformity may not be obtained.

With the present preferred embodiment, a low-temperature chemical liquid serving as the low-temperature liquid is supplied to the plurality of inner upstream flow passages (the first upstream flow passage 48A to the third upstream flow passage 48C), and mixed with a high-temperature chemical liquid serving as the high-temperature liquid flowing through these inner upstream flow passages. The low-temperature chemical liquid is a liquid of the same type as the high-temperature chemical liquid and lower in temperature than the high-temperature chemical liquid. Thus, whereas the high-temperature processing liquid is discharged from the outermost discharge port (the fourth discharge port 34D), a liquid (mixed liquid of the high-temperature processing liquid and the low-temperature processing liquid) lower in temperature than the high-temperature processing liquid is discharged from the plurality of inner discharge ports (the first discharge port 34A through the third discharge port 34C). The temperatures of the processing liquids supplied to the upper surface of the substrate W increase stepwise with distance away from the rotational axis A1. The temperature uniformity of the processing liquids on the substrate W can thus be increased in comparison to a case where the processing liquid of the same temperature is discharged from each discharge port 34. The processing uniformity can thereby be increased while reducing the consumption amount of the processing liquid.

Also with the present preferred embodiment, temperatures of liquids flowing through the plurality of inner upstream flow passages (the first upstream flow passage 48A to the third upstream flow passage 48C) are detected by the plurality of temperature sensors 77 at each of the inner upstream flow passages. The mixing ratio changing unit including the plurality of first flow control valves 50 and the plurality of second flow control valves 73 independently changes the mixing ratios of the high-temperature chemical liquid and the low-temperature chemical liquid to be mixed with each other at the plurality of inner upstream flow passages for each of the inner upstream flow passages based on detected values of the plurality of temperature sensors 77. Thus, the temperatures of the mixed liquids supplied to the plurality of inner discharge ports from the plurality of inner upstream flow passages can be approximated to preset temperatures more precisely.

The present invention is not restricted to the content of the preferred embodiment and various modifications are possible within the scope of the present invention.

For example, although with the preferred embodiment, the case where the first chemical liquid flow passage 42 that supplies the chemical liquid to the supply flow passage 47 is provided was described, a plurality of processing liquid flow passages that supply liquids to the supply flow passage 47 may be provided. Similarly, a plurality of processing liquid flow passages that supply liquids to the second chemical liquid flow passage 62 may be provided.

A feature of a certain preferred embodiment may be added to another preferred embodiment.

The present application corresponds to Japanese Patent Application Nos. 2015-029844, 2015-041378 and 2015-041348 respectively filed on Feb. 18, 2015, Mar. 3, 2015 and Mar. 3, 2015 in the Japan Patent Office, and the entire disclosures of these applications are incorporated herein by reference.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing apparatus comprising:
    a substrate holder rotating a substrate around a vertical rotational axis passing through a central portion of the substrate while holding the substrate horizontally;
    a chamber housing the substrate held by the substrate holder;
    a fluid box disposed on a lateral side of the chamber; and
    a processing liquid supplying system including a supply flow passage, a plurality of upstream flow passages, a plurality of component liquid flow passages, a plurality of discharge ports, and mixing ratio changing valves, and supplying the substrate held by the substrate holder with a processing liquid including a first liquid and a second liquid that generate heat upon mixing with each other; and
    wherein the supply flow passage guides the first liquid toward the plurality of upstream flow passages,
    the plurality of upstream flow passages branch from the supply flow passage inside the fluid box and guide the first liquid supplied from the supply flow passage toward the plurality of discharge ports,
    the plurality of component liquid flow passages are respectively connected to the plurality of upstream flow passages inside the fluid box and supply each of the plurality of upstream flow passages with the second liquid to be mixed with the first liquid,
    the plurality of discharge ports are respectively connected to the plurality of upstream flow passages at positions further downstream than the plurality of component liquid flow passages, and are respectively disposed at a plurality of positions differing in distance from the rotational axis, and respectively discharge the processing liquid including the first liquid and the second liquid mixed at the plurality of upstream flow passages toward a plurality of positions within an upper surface of the substrate including an upper surface central portion of the substrate,
    the mixing ratio changing valves independently change mixing ratios of the first liquid and the second liquid included in the processing liquid to be discharged from the plurality of discharge ports for each of the upstream flow passages, and
    the plurality of discharge ports include an innermost discharge port that overlaps with the central portion of the substrate in a plan view and an outermost discharge pore that overlaps with a peripheral edge portion of the substrate in a plan view.

2. The substrate processing apparatus according to claim 1, wherein
    downstream ends of the plurality of upstream flow passages are respectively disposed at a plurality of positions differing in distance from the rotational axis and
    the mixing ratio changing valves independently change the mixing ratios for each of the upstream flow passages such that mixing ratios of the first liquid and the second liquid approach a maximum mixing ratio at which a temperature of the processing liquid reaches its peak as a distance from the rotational axis to the upstream flow passage increases.

3. The substrate processing apparatus according to claim 2, wherein
    the mixing ratio changing valves independently change the mixing ratios for each of the upstream flow passages such that the temperature of the processing liquid at the plurality of upstream flow passages increases as the distance from the rotational axis to the upstream flow passage increases.

4. The substrate processing apparatus according to claim 1, wherein
    the mixing ratio changing valves include at least one of a plurality of first flow control valves and a plurality of second flow control valves,
    the first flow control valves are respectively connected to the plurality of upstream flow passages at positions further upstream than the plurality of component liquid flow passages and independently change flow rates of the first liquid to be mixed with the second liquid for each of the upstream flow passages, and the second flow control valves are respectively connected to the plurality of component liquid flow passages and independently change flow rates of the second liquid to be mixed with the first liquid for each of the component liquid flow passages.

5. The substrate processing apparatus according to claim 1, wherein
the processing liquid supplying system further includes a plurality of downstream flow passages,
the plurality of discharge ports include a main discharge port discharging the processing liquid toward the upper surface central portion of the substrate and a plurality of auxiliary discharge ports discharging the processing liquid toward a plurality of positions within the upper surface of the substrate, the plurality of positions being away from the upper surface central portion and differing in distance from the rotational axis,
the plurality of upstream flow passages include a main upstream flow passage connected to the main discharge port and a plurality of auxiliary upstream flow passages connected to the plurality of auxiliary discharge ports via the plurality of downstream flow passages, and
each of the plurality of auxiliary upstream flow passages is a branching upstream flow passage that branches into a plurality of the downstream flow passages and each auxiliary discharge port is respectively provided according to each downstream flow passage.

6. The substrate processing apparatus according to claim 5, wherein
the branching upstream flow passages branch into the plurality of downstream flow passages inside the chamber.

7. The substrate processing apparatus according to claim 1, wherein
the processing liquid supplying system further includes an upstream heater and a plurality of downstream heaters
the upstream heater heats the first liquid to be supplied to the supply flow passage at an upstream temperature,
the plurality of discharge ports include a main discharge port discharging the processing liquid toward the upper surface central portion of the substrate, and a plurality of auxiliary discharge ports discharging the processing liquid toward a plurality of positions within the upper surface of the substrate, the plurality of positions being away from the upper surface central portion and differing in distance from the rotational axis,
the plurality of upstream flow passages include a main upstream flow passage connected to the main discharge port and a plurality of auxiliary upstream flow passages connected to the plurality of auxiliary discharge ports, and
the plurality of downstream heaters are respectively connected to the plurality of auxiliary upstream flow passages, and heat the processing liquid flowing through the plurality of auxiliary upstream flow passages at a downstream temperature higher than the upstream temperature.

8. The substrate processing apparatus according to claim 1, wherein
the processing liquid supplying system further includes a first nozzle and a second nozzle,
the plurality of discharge ports include a first discharge port, disposed in the first nozzle, and a second discharge port, disposed in the second nozzle, and are aligned in a radial direction orthogonal to the rotational axis in a plan view,
the first nozzle includes a first arm portion extending in a horizontal longitudinal direction and a first tip portion extending downward from a tip of the first arm portion,
the second nozzle includes a second arm portion extending in the longitudinal direction and a second tip portion extending downward from a tip of the second arm portion,
the first arm portion and the second arm portion are aligned in a horizontal alignment direction orthogonal to the longitudinal direction, and
the tip of the first arm portion and the tip of the second arm portion are separated in the longitudinal direction in a plan view such that the tip of the first arm portion is positioned at the rotational axis side.

9. A substrate processing apparatus comprising:
a substrate holder rotating a substrate around a vertical rotational axis passing through a central portion of the substrate while holding the substrate horizontally; and
a processing liquid supplying system including an upstream heater, a supply flow passage, a plurality of upstream flow passages, a plurality of discharge ports, and a plurality of downstream heaters, and supplying a processing liquid to the substrate held by the substrate holder; and
wherein the upstream heater heats the processing liquid to be supplied to the supply flow passage at an upstream temperature,
the supply flow passage guides the processing liquid toward the plurality of upstream flow passages,
the plurality of upstream flow passages branch from the supply flow passage and guide the processing liquid supplied from the supply flow passage toward the plurality of discharge ports,
the plurality of discharge ports include a main discharge port discharging the processing liquid toward an upper surface central portion of the substrate and a plurality of auxiliary discharge ports discharging the processing liquid toward a plurality of positions within an upper surface of the substrate, the plurality of positions being away from the upper surface central portion and differing in distance from the rotational axis, and are respectively disposed at a plurality of positions differing in distance from the rotational axis, and respectively discharge the processing liquid supplied via the plurality of upstream flow passages toward the upper surface of the substrate held by the substrate holder,
the plurality of upstream flow passages include a main upstream flow passage connected to the main discharge port and a plurality of auxiliary upstream flow passages connected to the plurality of auxiliary discharge ports,
the plurality of downstream heaters are respectively connected to the plurality of auxiliary upstream flow passages at positions further upstream than the plurality of auxiliary discharge ports, and heat the processing liquid flowing through the plurality of auxiliary upstream flow passages at a downstream temperature higher than the upstream temperature, and
the plurality of discharge ports include an innermost discharge port that overlaps with the central portion of the substrate in a plan view and an outermost discharge port that overlaps with a peripheral edge portion of the substrate in a plan view.

10. A substrate processing apparatus comprising:
a substrate holder rotating a substrate around a vertical rotational axis passing through a central portion of the substrate while holding the substrate horizontally; and a processing liquid supplying system including an upstream heater, a supply flow passage, a plurality of upstream flow passages, a plurality of discharge ports, and a plurality of low-temperature liquid flow passages, and supplying a processing liquid to the substrate held by the substrate holder; and wherein the upstream heater heats a high-temperature liquid to be supplied to the supply flow passage, the supply flow passage guides the high-temperature liquid toward the plurality of upstream flow passages, the plurality of upstream flow passages include an outer upstream flow passage and a plurality of inner upstream flow passages, and branch from the supply flow passage, and guide the high-temperature liquid supplied from the supply flow passage toward the plurality of discharge ports, the plurality of discharge ports include an outer discharge port that is connected to the outer upstream flow passage and discharges the processing liquid toward an upper surface peripheral edge portion of the substrate and a plurality of inner discharge ports that are connected to the plurality of inner upstream flow passages and respectively discharge the processing liquid toward a plurality of positions inside the upper surface peripheral edge portion and within an upper surface of the substrate, and are respectively disposed at positions differing in distance from the rotational axis, and discharge the processing liquid supplied via the plurality of upstream flow passages toward the upper surface of the substrate, the plurality of low-temperature liquid flow passages are respectively connected to the plurality of inner upstream flow passages at positions further upstream than the plurality of inner discharge ports without being connected to the outer upstream flow passage, and guide a low-temperature liquid, that is a liquid of the same type as the high-temperature liquid flowing through the supply flow passage and lower in temperature than the high-temperature liquid, toward the plurality of inner upstream flow passages, and the plurality of discharge ports include an innermost discharge port that overlaps with the central portion of the substrate in a plan view and an outermost discharge port that overlaps with a peripheral edge portion of the substrate in a plan view.

11. The substrate processing apparatus according to claim 10, wherein the processing liquid supplying system further includes a plurality of temperature sensors and mixing ratio changing valves, the plurality of temperature sensors are respectively connected to the plurality of inner upstream flow passages, and detect a temperature of a liquid at the plurality of inner upstream flow passages, and the mixing ratio changing valves independently change mixing ratios of the high-temperature liquid and the low-temperature liquid to be mixed with each other at the plurality of inner upstream flow passages for each of the inner upstream flow passages.

12. The substrate processing apparatus according to claim 11, wherein the mixing ratio changing valves include at least one of a plurality of first flow control valves and a plurality of second flow control valves, the first flow control valves are respectively connected to the plurality of inner upstream flow passages at positions further upstream than the plurality of low-temperature liquid flow passages and independently change flow rates of the high-temperature liquid to be mixed with the low-temperature liquid for each of the inner upstream flow passages, and the second flow control valves are respectively connected to the plurality of low-temperature liquid flow passages and independently change flow rates of the low-temperature liquid to be mixed with the high-temperature liquid for each of the low-temperature liquid flow passages.

* * * * *

UNITED STATES PATENT AND TRADEMARK OFFICE
CERTIFICATE OF CORRECTION

PATENT NO. : 10,403,517 B2
APPLICATION NO. : 15/044452
DATED : September 3, 2019
INVENTOR(S) : Kenji Kobayashi et al.

It is certified that error appears in the above-identified patent and that said Letters Patent is hereby corrected as shown below:

In the Claims

Claim 1 at Column 38, Line 35, the word "pore" should be -- port --.

Signed and Sealed this
Twenty-sixth Day of November, 2019

Andrei Iancu
*Director of the United States Patent and Trademark Office*